US010497816B2

(12) United States Patent
Aketa et al.

(10) Patent No.: US 10,497,816 B2
(45) Date of Patent: Dec. 3, 2019

(54) SEMICONDUCTOR DEVICE

(71) Applicant: ROHM CO., LTD., Kyoto (JP)

(72) Inventors: Masatoshi Aketa, Kyoto (JP); Yuta Yokotsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/045,552

(22) Filed: Jul. 25, 2018

(65) Prior Publication Data

US 2018/0351005 A1 Dec. 6, 2018

Related U.S. Application Data

(63) Continuation of application No. 15/788,023, filed on Oct. 19, 2017, now Pat. No. 10,056,502, which is a (Continued)

(30) Foreign Application Priority Data

Jul. 28, 2011 (JP) .................................. 2011-165660

(51) Int. Cl.
*H01L 29/872* (2006.01)
*H01L 29/06* (2006.01)
(Continued)

(52) U.S. Cl.
CPC .......... *H01L 29/872* (2013.01); *H01L 23/535* (2013.01); *H01L 29/06* (2013.01); *H01L 29/0607* (2013.01); *H01L 29/0615* (2013.01); *H01L 29/0619* (2013.01); *H01L 29/0623* (2013.01); *H01L 29/0634* (2013.01); *H01L 29/0692* (2013.01); *H01L 29/08* (2013.01); (Continued)

(58) Field of Classification Search
None
See application file for complete search history.

(56) References Cited

U.S. PATENT DOCUMENTS 5,262,669 A 11/1993 Wakatabe et al.
6,501,146 B1 12/2002 Harada
(Continued)

FOREIGN PATENT DOCUMENTS

JP H04-321274 A 11/1992
JP H7221327 A 8/1995
(Continued)

OTHER PUBLICATIONS

Mutsumi Sawada et al. "Low On-Resistance Trench Lateral Power MOSFET Integration Technology", Fuji Electric Journal, vol. 76, No. 3, 2003.
(Continued)

*Primary Examiner* — Minh Loan Tran

(57) ABSTRACT

The semiconductor device of the present invention includes a first conductivity type semiconductor layer made of SiC, a Schottky electrode formed to come into contact with at least a portion of a surface of the semiconductor layer, a field region surrounding the Schottky electrode, an annular trench formed on the field region and surrounding the Schottky electrode and a second conductivity type layer formed under a portion of the Schottky electrode outside at least the portion of the surface of the semiconductor layer.

27 Claims, 30 Drawing Sheets

Related U.S. Application Data continuation of application No. 15/403,875, filed on Jan. 11, 2017, now Pat. No. 9,818,886, which is a continuation of application No. 14/796,375, filed on Jul. 10, 2015, now Pat. No. 9,577,118, which is a continuation of application No. 14/235,784, filed as application No. PCT/JP2012/069208 on Jul. 27, 2012, now Pat. No. 9,111,852.

(51) Int. Cl.
  H01L 29/861    (2006.01)
  H01L 29/08     (2006.01)
  H01L 29/16     (2006.01)
  H01L 29/20     (2006.01)
  H01L 23/535    (2006.01)
  H01L 29/36     (2006.01)
  H01L 29/66     (2006.01)

(52) U.S. Cl.
  CPC ...... H01L 29/1602 (2013.01); H01L 29/1608 (2013.01); H01L 29/2003 (2013.01); H01L 29/36 (2013.01); H01L 29/66143 (2013.01); H01L 29/861 (2013.01); H01L 29/8613 (2013.01); H01L 29/8725 (2013.01)

(56) References Cited

U.S. PATENT DOCUMENTS

| | | | |
|---|---|---|---|
| 8,026,558 | B2 | 9/2011 | Grebs et al. |
| 8,154,073 | B2 | 4/2012 | Aoki et al. |
| 8,222,649 | B2 | 7/2012 | Miura et al. |
| 8,405,184 | B2* | 3/2013 | Chao ............ H01L 29/404 257/483 |
| 8,633,560 | B2 | 1/2014 | Aketa |
| 9,111,852 | B2 | 8/2015 | Aketa et al. |
| 9,252,210 | B2 | 2/2016 | Aketa |
| 10,056,502 | B2* | 8/2018 | Aketa ............ H01L 29/872 |
| 2002/0125541 | A1 | 9/2002 | Korec et al. |
| 2002/0175342 | A1 | 11/2002 | Tsui et al. |
| 2002/0179993 | A1 | 12/2002 | Hshieh et al. |
| 2003/0162355 | A1 | 8/2003 | Sankin et al. |
| 2004/0135153 | A1 | 7/2004 | Ryu et al. |
| 2005/0077591 | A1 | 4/2005 | Fukuda et al. |
| 2005/0136613 | A1* | 6/2005 | Poveda ........... H01L 29/402 438/424 |
| 2006/0076639 | A1 | 4/2006 | Lypen et al. |
| 2006/0255407 | A1 | 11/2006 | Ishida |
| 2007/0023781 | A1 | 2/2007 | Mizukami et al. |
| 2007/0228505 | A1 | 10/2007 | Mazzola et al. |
| 2008/0128850 | A1 | 6/2008 | Goerlach et al. |
| 2008/0197439 | A1 | 8/2008 | Goerlach et al. |
| 2009/0218619 | A1 | 9/2009 | Hebert et al. |
| 2009/0253234 | A1 | 10/2009 | Lee |
| 2011/0095301 | A1 | 4/2011 | Tarui |
| 2012/0018836 | A1 | 1/2012 | Nagai et al. |
| 2012/0267748 | A1 | 10/2012 | Suzuki |
| 2012/0309208 | A1 | 12/2012 | Tanida |
| 2012/0313212 | A1 | 12/2012 | Sugawara |
| 2013/0140584 | A1 | 6/2013 | Kameshiro et al. |
| 2013/0168765 | A1* | 7/2013 | Lin ............... H01L 29/8725 257/334 |
| 2014/0035090 | A1 | 2/2014 | Qu et al. |
| 2016/0181356 | A1 | 6/2016 | Aketa |

FOREIGN PATENT DOCUMENTS

| | | |
|---|---|---|
| JP | H10-012861 A | 1/1998 |
| JP | H11-8399 A | 1/1999 |
| JP | 2000323488 A | 11/2000 |
| JP | 2001-068688 A | 3/2001 |
| JP | 2003-158259 A | 5/2003 |
| JP | 2004-529506 A | 9/2004 |
| JP | 2005-079339 A | 3/2005 |
| JP | 2005-518672 A | 6/2005 |
| JP | 2007-012801 A | 1/2007 |
| JP | 2007-036052 A | 2/2007 |
| JP | 2008-519448 A | 6/2008 |
| JP | 2009-105200 A | 5/2009 |
| JP | 4382360 B2 | 12/2009 |
| JP | 2010-087483 A | 4/2010 |
| JP | 2010074058 A | 4/2010 |
| JP | 2011-009797 A | 1/2011 |
| JP | 2011-066207 A | 3/2011 |
| JP | 2011-096757 A | 5/2011 |
| JP | 2011-114028 A | 6/2011 |
| JP | 3172075 U | 11/2011 |
| JP | 5122810 B2 | 1/2013 |
| JP | 2017063237 A | 3/2017 |

OTHER PUBLICATIONS

JP: Office Action of 2018-149453 (related application); dated Jun. 6, 2019; 14 pages.

* cited by examiner

Trapezoidal trench structure
($\theta 1=115°>90°$, R=0.125L or $1/(1\times10^7)$(m))
+Bottom wall p type layer Trapezoidal trench structure
($\theta 1=115°>90°$, R=0.125L or $1/(1\times10^7)$(m))
+Side wall p type layer

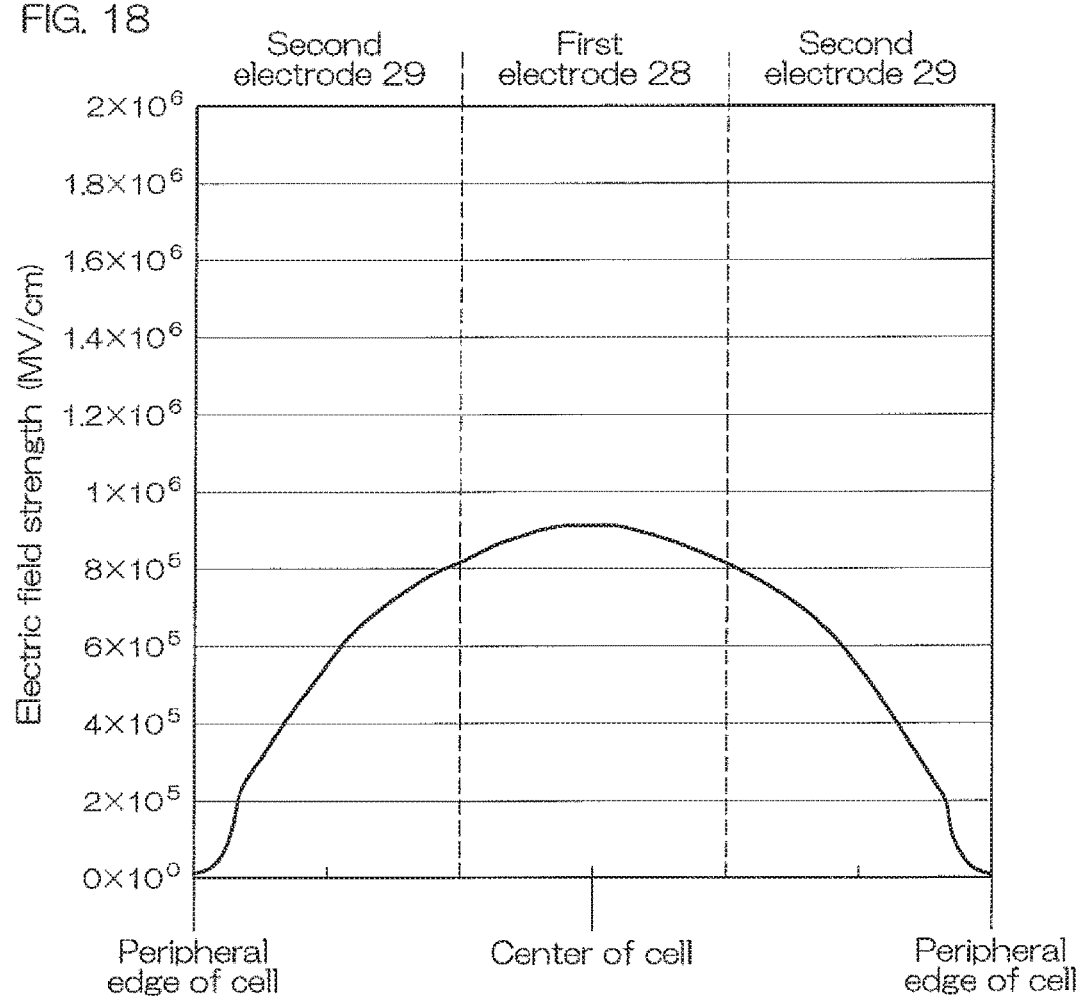

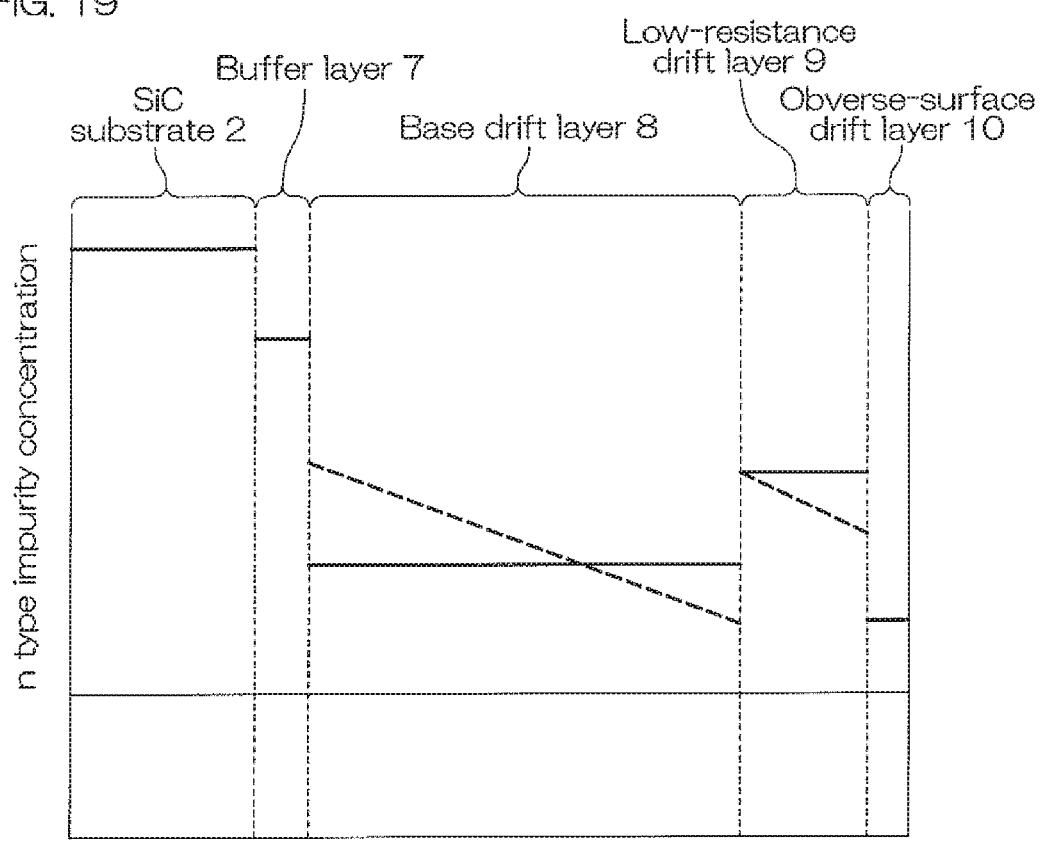

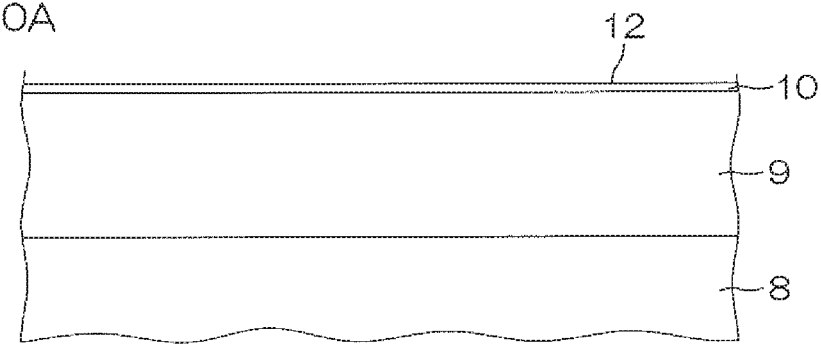
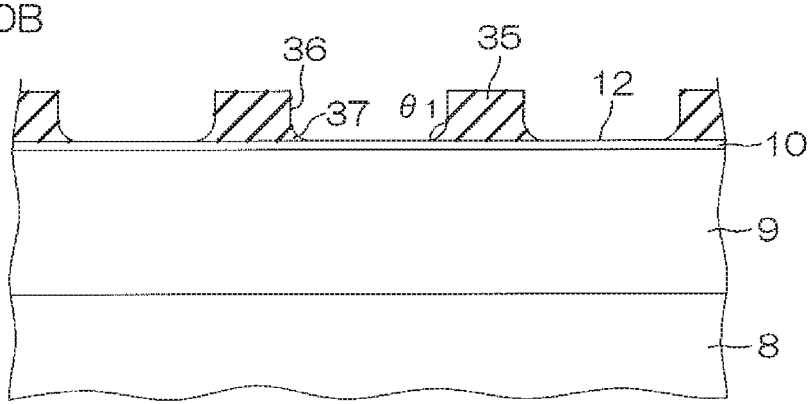

FIG. 21
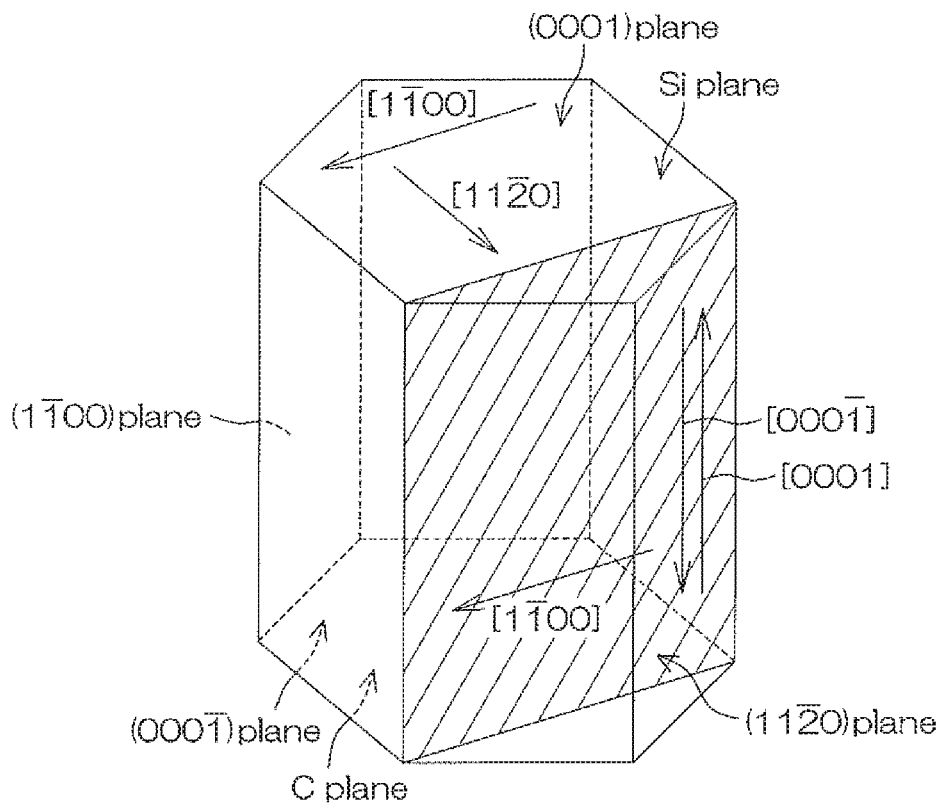
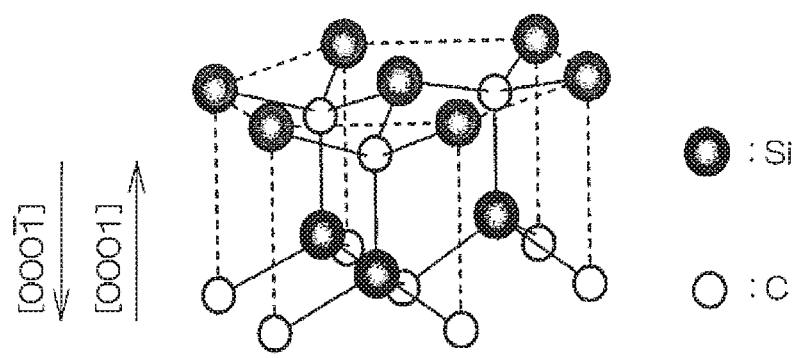

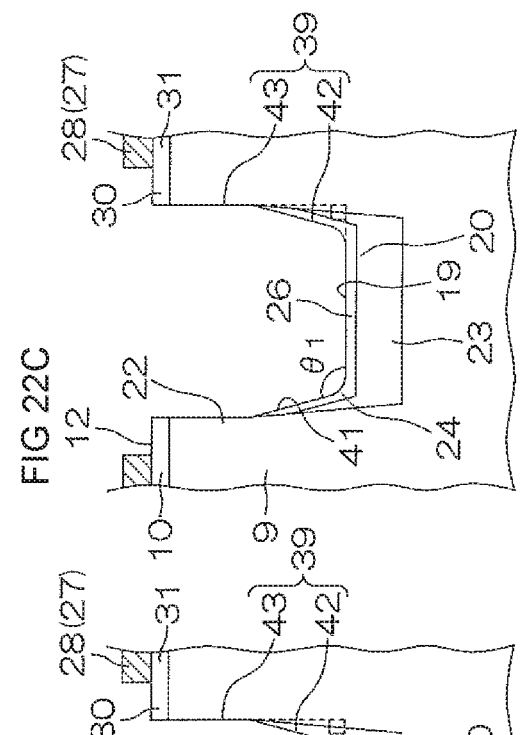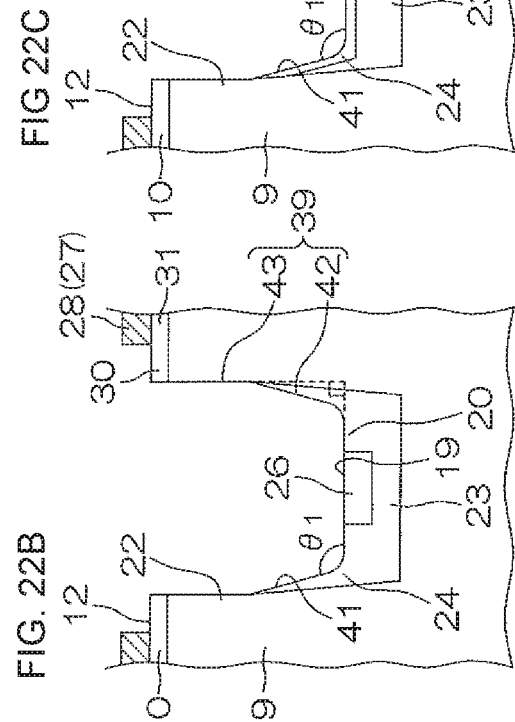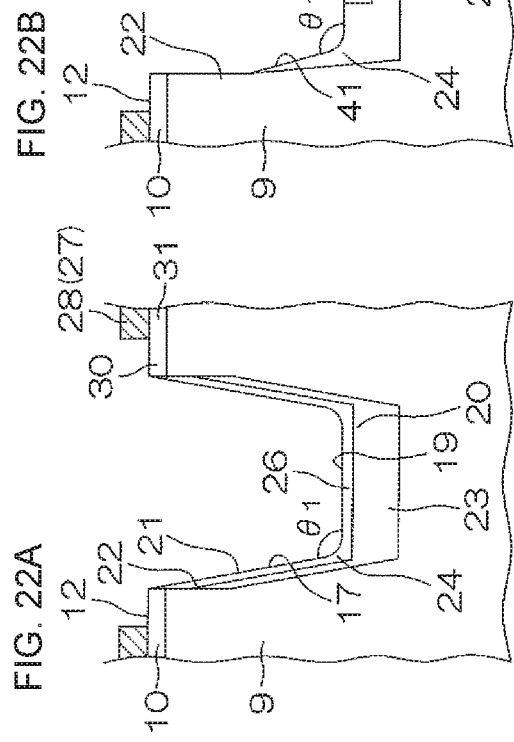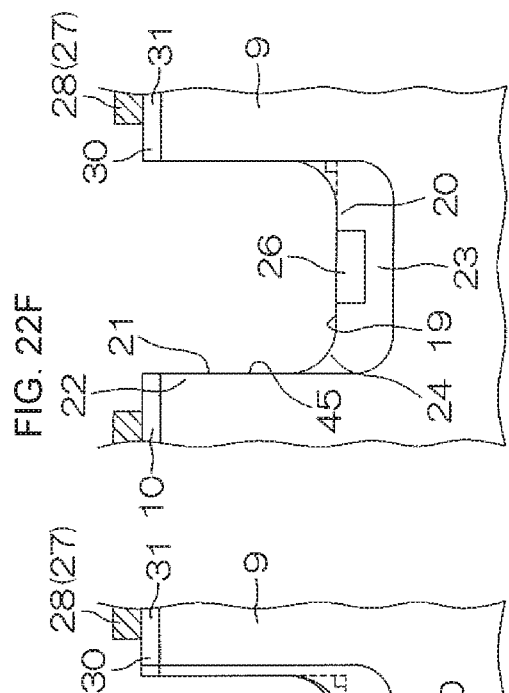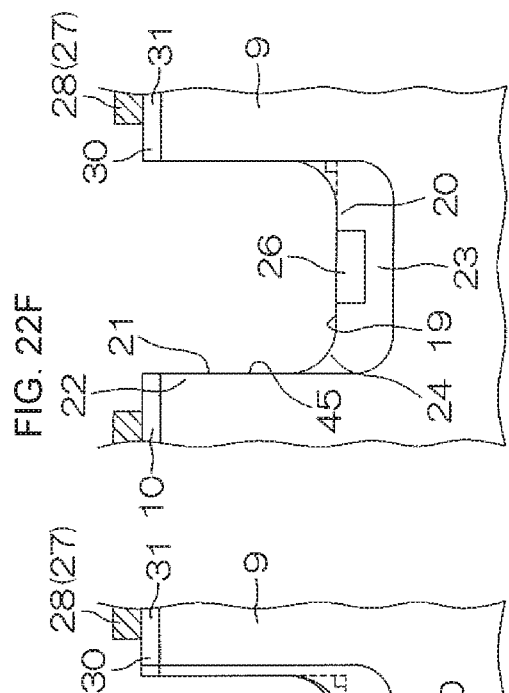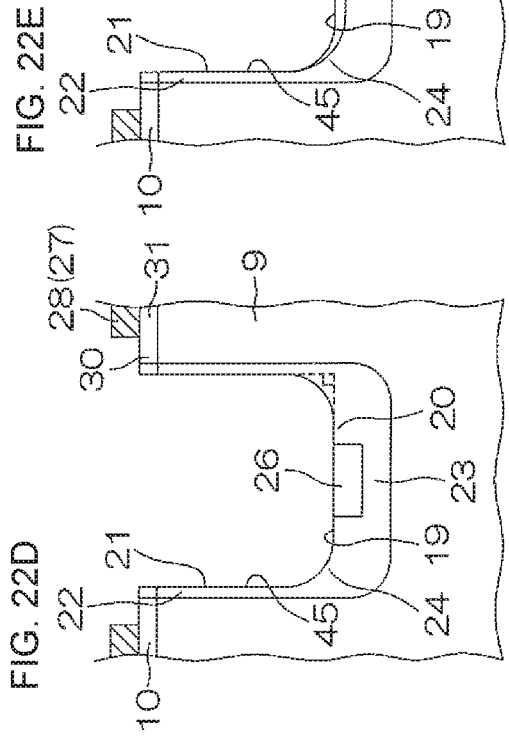

FIG. 25
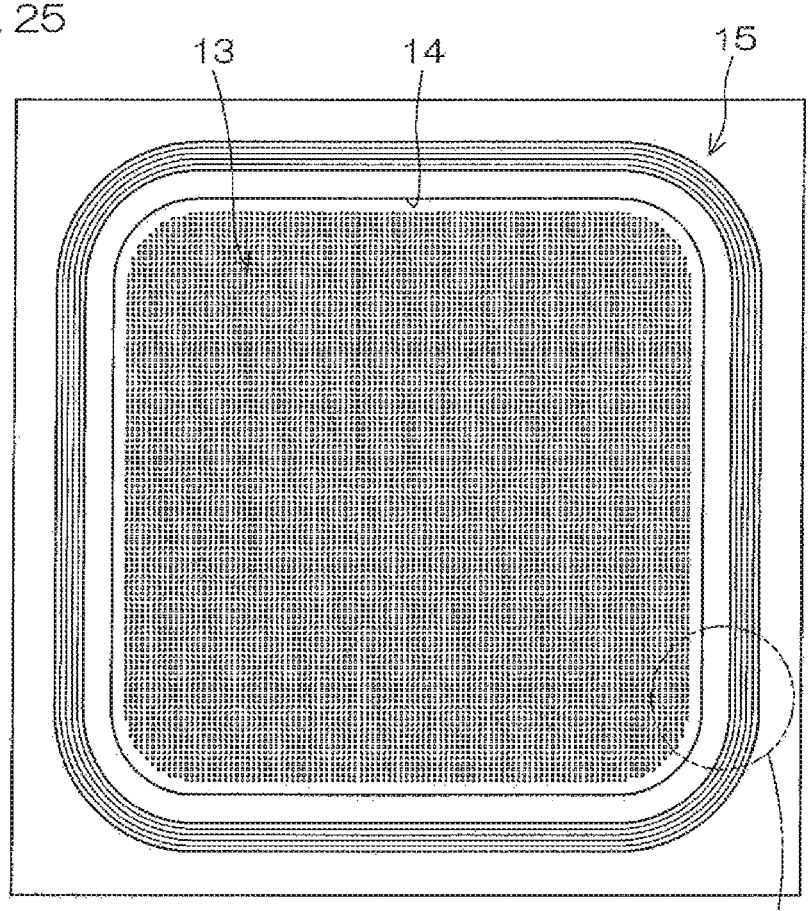
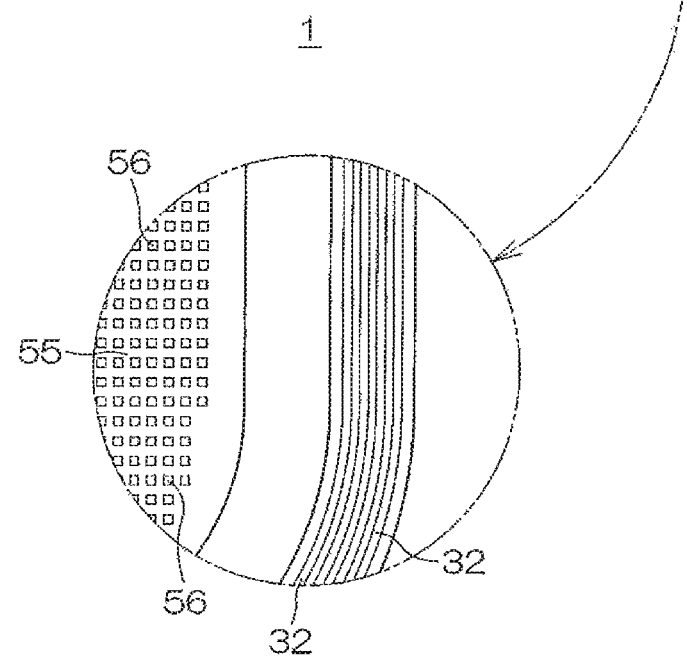

SEMICONDUCTOR DEVICE

CROSS-REFERENCE TO RELATED APPLICATION

This is a continuation of U.S. application Ser. No. 15/788,023, filed on Oct. 19, 2017, and allowed on Apr. 24, 2018, which is a continuation of U.S. application Ser. No. 15/403,875, filed on Jan. 11, 2017 (issued on Nov. 14, 2017 as U.S. Pat. No. 9,818,886), which is a continuation of U.S. application Ser. No. 14/796,375, filed on Jul. 10, 2015 (issued on Feb. 21, 2017 as U.S. Pat. No. 9,577,118), which is a continuation of U.S. application Ser. No. 14/235,784, filed on Feb. 12, 2014 (issued on Aug. 18, 2015 as U.S. Pat. No. 9,111,852), which was a National Stage application of PCT/JP2012/069208, filed on Jul. 27, 2012, and claims the benefit of priority of Japanese Patent Application No. 2011-165660, filed on Jul. 28, 2011. The disclosures of these prior U.S. and foreign applications are incorporated herein by reference.

TECHNICAL FIELD

The present invention relates to a semiconductor device that includes a Schottky barrier diode made of a wide bandgap semiconductor.

BACKGROUND ART

Heretofore, attention has been paid to a semiconductor device (semiconductor power device) for use chiefly in a system in various power electronics fields, such as a motor control system or a power conversion system.

For example, FIG. 1 of Patent Literature 1 discloses a Schottky barrier diode in which SiC is employed. This Schottky barrier diode is composed of an n type 4H—SiC bulk substrate, an n type epitaxial layer that has grown on the bulk substrate, an oxide film that is formed on a surface of the epitaxial layer and that partially exposes the surface of the epitaxial layer, and a Schottky electrode that is formed in an opening of the oxide film and that makes a Schottky junction with the epitaxial layer.

FIG. 8 of Patent Literature 1 discloses a vertical MIS field-effect transistor in which SiC is employed. This vertical MIS field-effect transistor is composed of an n type 4H—SiC bulk substrate, an n type epitaxial layer that has grown on the bulk substrate, an n type impurity region (source region) that is formed on a surface layer part of the epitaxial layer, a p type well region that is formed adjacently to both sides of the n type impurity region, a gate oxide film that is formed on a surface of the epitaxial layer, and a gate electrode that faces the p type well region through the gate oxide film.

CITATION LIST

Patent Literature

PTL 1: Japanese Unexamined Patent Publication No. 2005-79339
PTL 2: Japanese Unexamined Patent Publication No. 2011-9797

SUMMARY OF INVENTION

Solution to Problem

The semiconductor device of the present invention includes a first conductivity type semiconductor layer made of a wide bandgap semiconductor and a Schottky electrode formed to come into contact with a surface of the semiconductor layer, in which a threshold voltage $V_{th}$ is 0.3 V to 0.7 V, and a leakage current $J_r$ in a rated voltage $V_R$ is $1\times10^{-9}$ A/cm² to $1\times10^{-4}$ A/cm².

According to this arrangement, a threshold voltage Vth is 0.3 V to 0.7 V, and a leakage current $J_r$ in a rated voltage $V_R$ is $1\times10^{-9}$ A/cm² to $1\times10^{-4}$ A/cm², and therefore a current-carrying loss can be reduced to be equal to or to be smaller than that of an Si-pn diode while a switching loss can be smaller than the Si-pn diode. As a result, it is built in a power module for use in, for example, an inverter circuit that forms a driving circuit to drive an electric motor used as a power source for electric vehicles (including hybrid automobiles), trains, industrial robots, etc., and hence it is possible to achieve a power module that is high in withstanding pressure and that is low in loss.

Preferably, when a breakdown voltage $V_B$ of the semiconductor device is 700 V or more, the rated voltage $V_R$ of the semiconductor device is 50 to 90% of the breakdown voltage $V_B$ that is 700 V or more.

Additionally, preferably, on-resistance $R_{on}\cdot A$ of the semiconductor device is 0.3 mΩ·cm² to 3 mΩ·cm².

Preferably, in order to set the threshold voltage $V_{th}$ of the semiconductor device at 0.3 V to 0.7 V and in order to set the leakage current $J_r$ in the rated voltage $V_R$ at $1\times10^{-9}$ A/cm² to $1\times10^{-4}$ A/cm², for example, a trench having a side wall and a bottom wall is formed on the surface side of the semiconductor layer, and an edge part of the bottom wall of the trench has a curvature radius R that satisfies the following formula (1):

$$0.01L < R < 10L \qquad (1)$$

(In formula (1), L designates a linear distance between edge parts facing each other along a width direction of the trench.)

The wide bandgap semiconductor has a breakdown voltage $V_B$ extremely higher than silicon, and a semiconductor device using such a wide bandgap semiconductor can fulfill high pressure resistance. This results from the fact that the wide bandgap semiconductor is extremely higher in insulation breakdown electric field strength than silicon. Therefore, it is possible to design a device having a comparatively high rated voltage $V_R$ by use of a Schottky barrier diode structure.

Therefore, when a high reverse voltage is applied to such a Schottky barrier diode, a high electric field is applied to the wide bandgap semiconductor even if the diode does not break down although a comparatively high voltage can be treated in the Schottky barrier diode. Therefore, if the height (barrier height) of a Schottky barrier between the Schottky electrode and the wide bandgap semiconductor is lowered in order to reduce the threshold voltage $V_{th}$ of the Schottky barrier diode, a leakage current $J_r$ (reverse leakage current) flowing beyond the Schottky barrier during application of a reverse voltage will increase because the electric field strength of the wide bandgap semiconductor and that of the Schottky interface are great.

From the viewpoint of preventing an increase in reverse leakage current $J_r$ in a Schottky barrier diode having a wide bandgap semiconductor, a high reverse voltage is required not to be applied, and the barrier height is required to be increased to some extent. As a result, disadvantageously, the pressure resistance of the wide bandgap semiconductor that makes it possible to prevent a breakdown cannot be efficiently utilized even if a high reverse voltage is applied.

Here, let it be considered the distribution of electric field strength when a reverse voltage is applied. First, when a reverse voltage is applied to a semiconductor layer (e.g., n type) that is made of a wide bandgap semiconductor and that is not provided with a trench, the electric field strength usually becomes higher in proportion to an approach to the surface from the reverse surface of the semiconductor layer, and reaches the maximum at the surface of the semiconductor layer.

Therefore, in a Schottky barrier diode in which a Schottky electrode is allowed to make a Schottky junction with the surface of a semiconductor layer having such a structure and in which the height (barrier height) of a Schottky barrier between the Schottky electrode and the semiconductor layer is lowered, it is difficult to reduce a reverse leakage current $J_r$ flowing beyond the Schottky barrier because the electric field strength at the surface of the semiconductor layer is high when a reverse voltage closer to a breakdown voltage $V_B$ is applied.

Therefore, although it is conceivable that a trench is formed at the semiconductor layer and that a part (generation source of a leakage current) of the semiconductor layer on which an electric field is concentrated is shifted to a bottom part of the trench, the electric field will concentrate on an edge part of the bottom wall of the trench if so, and therefore a problem arises in which sufficient withstanding pressure cannot be obtained if the edge part has a sharp shape.

Therefore, according to the present invention, the electric field that concentrates on the edge part of the bottom wall of the trench can be moderated to improve withstanding pressure by setting the curvature radius R of the edge part of the bottom wall of the trench so as to satisfy the relation 0.01L<R<10L. Of course, the electric field strength in the surface of the semiconductor layer can be weakened because a trench is formed on the surface side of the semiconductor layer. As a result, the reverse leakage current $J_r$ can be set at $1 \times 10^{-9}$ A/cm$^2$ to $1 \times 10^{-4}$ A/cm$^2$ even if a barrier height between the Schottky electrode and the semiconductor layer contiguous to the surface of the semiconductor layer is lowered and even if the reverse voltage closer to a breakdown voltage is applied. As a result, the threshold voltage $V_{th}$ can be reduced to be 0.3 V to 0.7 V by lowering the barrier height while the reverse leakage current $J_r$ can be reduced.

Preferably, in the semiconductor device of the present invention, the semiconductor layer includes a second conductivity type electric-field-moderating portion that is selectively formed at the bottom wall of the trench and at the edge part of the bottom wall.

In other words, preferably, in the present invention, an electric-field-moderating portion of a second conductivity type (e.g., p type) is additionally formed at the bottom wall of the trench and at the edge part of the bottom wall. This makes it possible to further reduce the reverse leakage current $J_r$ as the whole of the semiconductor device. In other words, the reverse leakage current $J_r$ can be made even smaller even if a reverse voltage closer to a breakdown voltage $V_B$ is applied, and therefore the pressure resistance of a wide bandgap semiconductor can be satisfactorily utilized.

In this case, more preferably, the electric-field-moderating portion is formed to straddle between the edge part of the bottom wall of the trench and the side wall of the trench, and, particularly preferably, the electric-field-moderating portion is formed to lead to an opening end of the trench along the side wall of the trench.

In the present invention, the Schottky electrode is a concept that includes both a metal electrode that makes a Schottky barrier with a semiconductor layer and a semiconductor electrode that is made of a dissimilar semiconductor having a bandgap differing from the bandgap of the semiconductor layer and that makes a heterojunction with the semiconductor layer (junction that forms a potential barrier with the semiconductor layer by using a bandgap difference). Hereinafter, in this description division, the Schottky junction and the heterojunction will be referred to generically as "Schottky junction," and the Schottky barrier and the potential barrier (heterobarrier) formed by the heterojunction will be referred to generically as "Schottky barrier," and the metal electrode and the semiconductor electrode will be referred to generically as "Schottky electrode."

Preferably, the trench includes a taper trench that has the bottom wall having a planar shape and the side wall inclined at an angle exceeding 90° with respect to the bottom wall having a planar shape.

If it is a taper trench, the withstanding pressure of the semiconductor device can be made even higher than when the side wall is erected rectangularly at 90° with respect to the bottom wall.

Additionally, in the taper trench, not only the bottom wall but also a part of or all of the side wall faces the open end of the trench. Therefore, for example, when a second conductivity type impurity is implanted to the semiconductor layer through the trench, an impurity that has entered the inside of the trench from the open end of the trench can be allowed to reliably impinge on the side wall of the trench. As a result, the aforementioned electric-field-moderating portion can be formed easily.

The taper trench is a concept that includes both a trench in which all of the side wall is inclined at an angle exceeding 90° with respect to the bottom wall and a trench in which a part of the side wall (e.g., part that forms the edge part of the trench) is inclined at an angle exceeding 90° with respect to the bottom wall.

Preferably, in the semiconductor device of the present invention, the Schottky electrode is formed so as to be embedded in the trench, and the electric-field-moderating portion has a contact portion that makes an ohmic contact with the Schottky electrode embedded in the trench at a part forming the bottom wall of the trench.

According to this arrangement, the Schottky electrode can be allowed to make an ohmic contact with the pn diode having a pn junction between the electric-field-moderating portion (second conductivity type) and the semiconductor layer (first conductivity type). This pn diode is disposed in parallel with the Schottky barrier diode (heterodiode) having a Schottky junction between the Schottky electrode and the semiconductor layer. This makes it possible to allow a part of a surge current to flow to a built-in pn diode even if this surge current flows to the semiconductor device. As a result, the surge current flowing through the Schottky barrier diode can be reduced, and therefore the Schottky barrier diode can be prevented from being thermally broken down by the surge current.

Preferably, in the semiconductor device of the present invention, if the semiconductor layer has a first part of a first conductivity type to which a first electric field is applied when a reverse voltage is applied and a second part of the first conductivity type to which a second electric field relatively higher than the first electric field is applied, the Schottky electrode includes a first electrode that forms a first Schottky barrier with the first part and a second electrode that forms a second Schottky barrier, which is relatively higher than the first Schottky barrier, with the second part.

In the present invention, there is a case in which a part having a relatively high electric field strength and a part having a relatively low electric field strength are present as shown in a relationship between the first part and the second part of the semiconductor layer.

Therefore, if the Schottky electrode is properly selected in accordance with the electric field distribution of the semiconductor layer when a reverse voltage is applied as described above, a leakage current can be restrained by the comparatively high second Schottky barrier in the second part to which the relatively high second electric field is applied when a reverse voltage is applied. On the other hand, in the first part to which the relatively low first electric field is applied, the fear that the reverse leakage current will flow beyond the Schottky barrier is slight even if the height of the Schottky barrier is lowered, and therefore an electric current can be allowed to preferentially flow at a low voltage during application of a forward voltage by setting the comparatively low first Schottky barrier. Therefore, according to this arrangement, the reverse leakage current $J_r$ and the threshold voltage $V_{th}$ can be efficiently reduced.

For example, when the electric-field-moderating portion is formed to lead to the opening end of the trench, the first part of the semiconductor layer is formed at a peripheral edge of the opening end of the trench in a surface layer part of the semiconductor layer, whereas the second part of the semiconductor layer is formed at a part adjoining the peripheral edge in the surface layer part of the semiconductor layer.

Preferably, in the semiconductor device of the present invention, when the semiconductor layer includes a base drift layer that has a first impurity concentration and a low-resistance drift layer that is formed on the base drift layer and that has a second impurity concentration relatively higher than the first impurity concentration, the trench is formed so that a deepest part thereof reaches the low-resistance drift layer, and a part of the semiconductor layer is partitioned as a unit cell.

In the unit cell partitioned by the trench, an area (current path) in which an electric current can be allowed to flow is restricted, and therefore there is a fear that the resistance value of the unit cell will rise if the impurity concentration of a part that forms the unit cell in the semiconductor layer is low. Therefore, as described above, all of or part of the unit cell can be formed with the low-resistance drift layer by forming the trench so that the deepest part reaches the low-resistance drift layer. Therefore, a rise in the resistance value can be restrained by the low-resistance drift layer having the comparatively high second impurity concentration even if the current path is narrowed in a part in which the low-resistance drift layer is formed. As a result, the unit cell can be made low in resistance.

The first impurity concentration of the base drift layer may become lower in proportion to an approach to the surface from a reverse surface of the semiconductor layer. Additionally, the second impurity concentration of the low-resistance drift layer may be constant in proportion to an approach to the surface from the reverse surface of the semiconductor layer, or may become lower in proportion to an approach to the surface from the reverse surface of the semiconductor layer.

Preferably, the semiconductor layer further includes an obverse-surface drift layer that is formed on the low-resistance drift layer and that has a third impurity concentration relatively lower than the second impurity concentration.

This arrangement makes it possible to reduce the impurity concentration of the surface layer part of the semiconductor layer, and therefore makes it possible to reduce the electric field strength applied to the surface layer part of the semiconductor layer when a reverse voltage is applied. As a result, the reverse leakage current $J_r$ can be made even smaller.

The semiconductor layer may further include a substrate and a buffer layer that is formed on the substrate and that has a fourth impurity concentration relatively higher than the first impurity concentration.

Additionally, the trench may include a stripe trench formed in a stripe manner, and may include a lattice trench formed in a grid-like manner.

Additionally, the chip size of the semiconductor device may be 0.5 mm/□ to 20 mm/□.

The wide bandgap semiconductor (whose bandgap is 2 eV or more) is a semiconductor in which an insulation breakdown electric field is greater than 1 MV/cm, and, more specifically, the wide bandgap semiconductor is made of SiC (e.g., 4H—SiC whose insulation breakdown electric field is about 2.8 MV/cm and whose bandgap width is about 3.26 eV), GaN (whose insulation breakdown electric field is about 3 MV/cm and whose bandgap width is about 3.42 eV), or diamond (whose insulation breakdown electric field is about 8 MV/cm and whose bandgap width is about 5.47 eV).

BRIEF DESCRIPTION OF DRAWINGS

FIG. 18 is a graph showing the electric field strength distribution in a surface of a unit cell of the Schottky barrier diode shown in FIG. 17.

FIG. 19 is a view to describe the impurity concentration of an SiC substrate and the impurity concentration of an SiC epitaxial layer.

FIG. 20A is a view showing a method for forming the trench and the p type layer shown in FIG. 2.

FIG. 20B is a view showing a step following FIG. 20A.

FIG. 21 is a schematic view that represents a unit cell having a 4H—SiC crystal structure.

FIGS. 22A, 22B, 22C, 22D, 22E, and 22F are views showing modifications of the cross-sectional shape of a trench, FIG. 22A being a first modification, FIG. 22B being a second modification, FIG. 22C being a third modification, FIG. 22D being a fourth modification, FIG. 22E being a fifth modification, FIG. 22F being a sixth modification.

FIG. 25 is a view showing a modification of the planar shape of a trench.

DESCRIPTION OF EMBODIMENTS

Figure 1A:
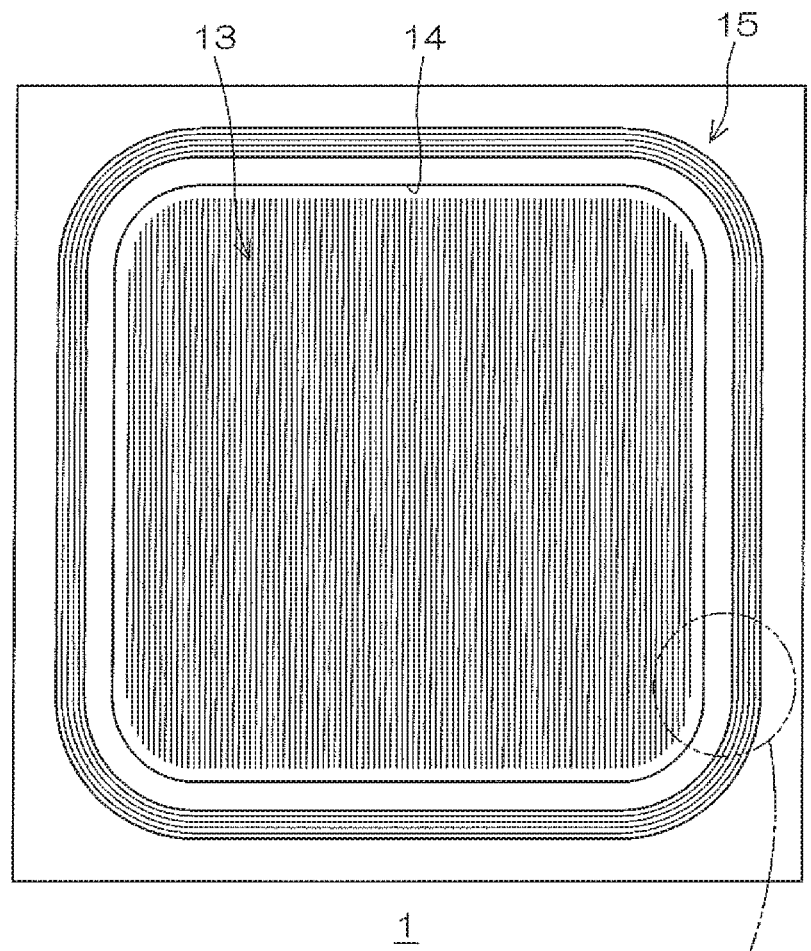
FIG. 1A and FIG. 1B are schematic plan views of a Schottky barrier diode according to an embodiment of the present invention, FIG. 1A being an overall view, FIG. 1B being an enlarged view of a main part.
Figure 1B:
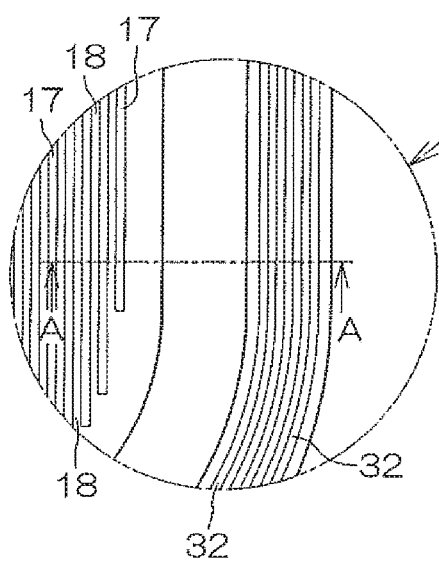
Figure 2:
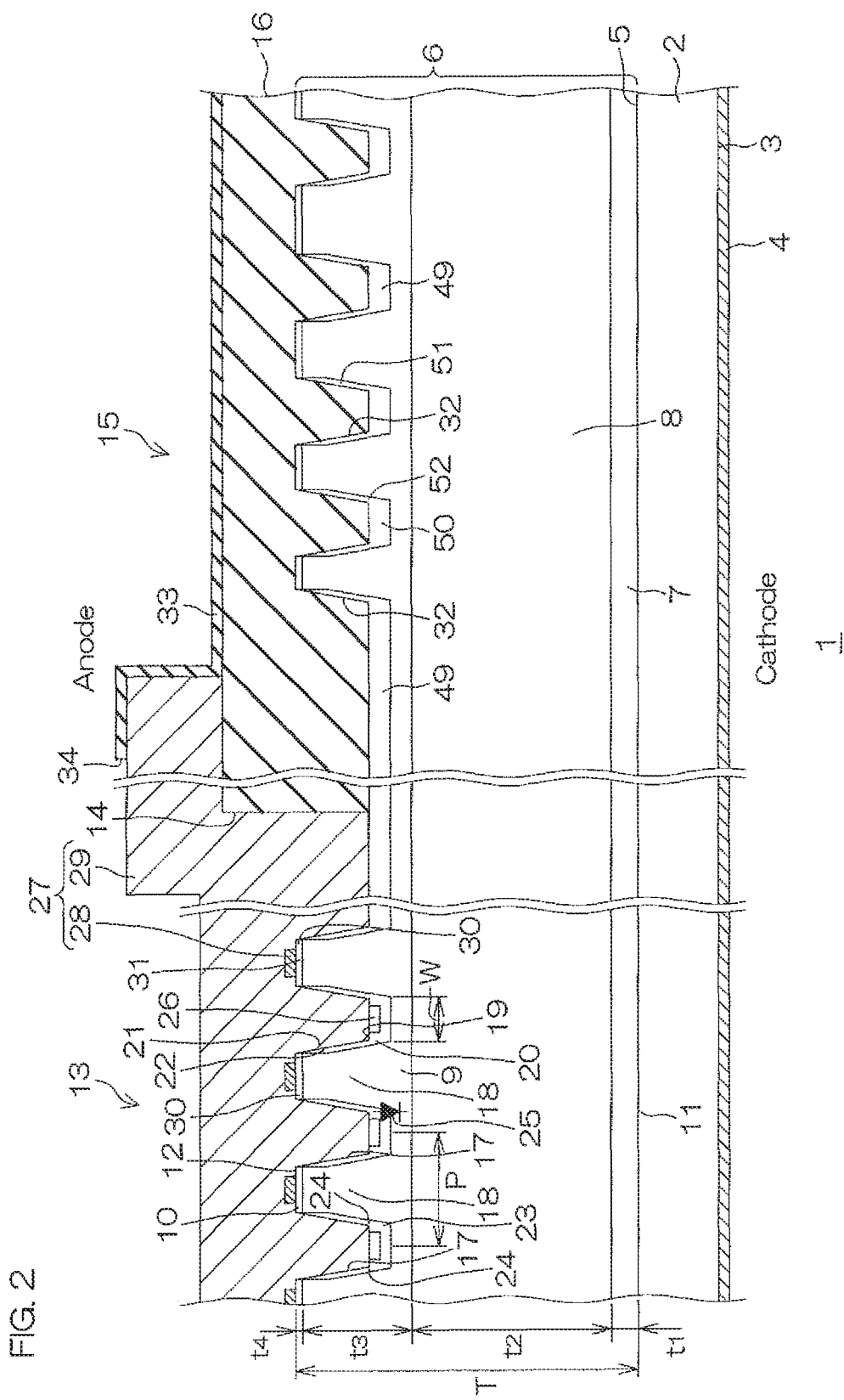
FIG. 2 is a sectional view of the Schottky barrier diode shown in FIG. 1A and FIG. 1B, showing a cutting plane in cutting-plane line A-A of FIG. 1B.
Figure 3:
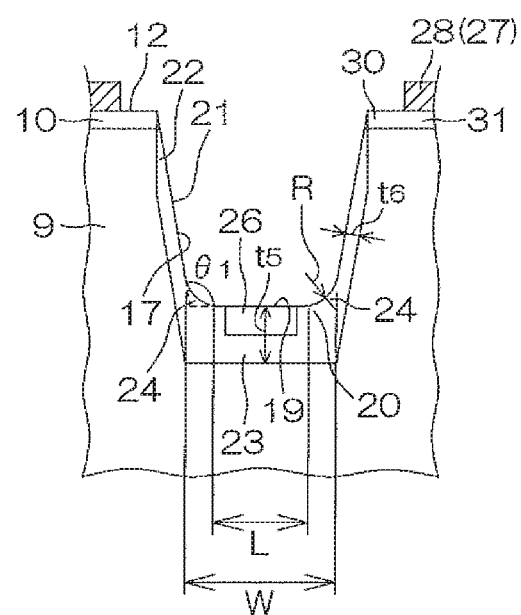
FIG. 3 is an enlarged view of a trench of FIG. 2.

Embodiments of the present invention will be hereinafter described in detail with reference to the accompanying drawings.
<Entire Structure of Schottky Barrier Diode>
FIG. 1A and FIG. 1B are schematic plan views of a Schottky barrier diode according to an embodiment of the present invention, and FIG. 1A is an overall view, and FIG. 1B is an enlarged view of a main part. FIG. 2 is a sectional view of the Schottky barrier diode shown in FIG. 1A and FIG. 1B, and shows a cutting plane in cutting-plane line A-A of FIG. 1B. FIG. 3 is an enlarged view of a trench of FIG. 2.

The Schottky barrier diode 1 serving as a semiconductor device is a Schottky barrier diode in which 4H—SiC (a wide bandgap semiconductor whose insulation breakdown electric field is about 2.8 MV/cm and whose bandgap width is about 3.26 eV) is employed, and, for example, is shaped like a chip having a square shape when viewed planarly. In the chip-shaped Schottky barrier diode 1, the length in each of the up, down, right, and left directions in the sheet of FIG. 1A is 0.5 mm to 20 mm. In other words, the chip size of the Schottky barrier diode 1 is, for example, 0.5 mm/□ to 20 mm/□.

The Schottky barrier diode 1 includes an $n^+$ type SiC substrate 2. The thickness of the SiC substrate 2 is, for example, 50 μm to 600 μm. For example, N (nitrogen), P (phosphorus), As (arsenic), etc., can be used as n type impurities.

A cathode electrode 4 serving as an ohmic electrode is formed on a reverse surface 3 of the SiC substrate 2 so as to cover its whole area. The cathode electrode 4 is made of a metal (e.g., Ti/Ni/Ag) that comes into ohmic contact with the n type SiC.

An n type SiC epitaxial layer 6 serving as a semiconductor layer is formed on a surface 5 of the SiC substrate 2.

The SiC epitaxial layer 6 has a laminated structure in which a buffer layer 7 and a drift layer having a three-layer structure consisting of a base drift layer 8, a low-resistance drift layer 9, and an obverse-surface drift layer 10 are stacked together in this order from the surface 5 of the SiC substrate 2. The buffer layer 7 forms a reverse surface 11 of the SiC epitaxial layer 6, and is in contact with the surface 5 of the SiC substrate 2. On the other hand, the obverse-surface drift layer 10 forms a surface 12 of the SiC epitaxial layer 6.

The total thickness T of the SiC epitaxial layer 6 is, for example, 3 μm to 100 μm. The thickness $t_1$ of the buffer layer 7 is, for example, 0.1 μm to 1 μm. The thickness $t_2$ of the base drift layer 8 is, for example, 2 μm to 100 μm. The thickness $t_3$ of the low-resistance drift layer 9 is, for example, 1 μm to 3 μm. The thickness $t_4$ of the obverse-surface drift layer 10 is, for example, 0.2 μm to 0.5 μm.

A field insulating film 16 is formed on the surface 12 of the SiC epitaxial layer 6. The field insulating film 16 has an opening 14 that exposes a part of the SiC epitaxial layer 6 as an active region 13 (whose active size is, for example, 0.1 mm² to 400 mm²) and covers a field region 15 surrounding the active region 13. The field insulating film 16 is made of, for example, $SiO_2$ (silicon oxide). The thickness of the field insulating film 16 is, for example, 0.5 μm to 3 μm.

A stripe trench that penetrates the obverse-surface drift layer 10 from the surface 12 of the SiC epitaxial layer 6 and that has its deepest part reaching a halfway part of the low-resistance drift layer 9 is formed on the side of the surface 12 in the active region 13. The stripe trench is formed such that a plurality of trapezoid trenches 17 (trenches each of which has a reverse-trapezoidal shape in a cross-sectional view when it is cut along a width direction perpendicular to its longitudinal direction) extending linearly in a direction in which a couple of opposite sides of the Schottky barrier diode 1 face each other are arranged parallel with each other at intervals. The center-to-center distance (pitch P) between the centers of adjoining trapezoid trenches 17 is, for example, 2 μm to 20 μm.

As a result, unit cells 18 (line cells) each of which is partitioned by being sandwiched between the adjoining trapezoid trenches 17 are formed in a stripe manner at the SiC epitaxial layer 6. In each unit cell 18, a base part that occupies most of its area is formed by the low-resistance drift layer 9, and a surface layer part on the side of the surface 12 with respect to the base part is formed by the obverse-surface drift layer 10.

Each trapezoid trench 17 is partitioned by a bottom wall 20 that forms a bottom surface 19 parallel to the surface 12 of the SiC epitaxial layer 6 and by a side wall 22 forming a side surface 21 inclined at angle $\theta_1$ (e.g., 95° to 150°) with respect to the bottom surface 19 from an edge part 24 of both ends in the width direction of the bottom wall 20 toward the surface 12 of the SiC epitaxial layer 6. The depth of each trapezoidal trench 17 (i.e., distance from the surface 12 of the SiC epitaxial layer 6 to the bottom surface 19 of the trapezoidal trench 17) is, for example, 3000 Å to 15000 Å. The width W (width of the deepest part) perpendicular to the longitudinal direction of each trapezoid trench 17 is 0.3 μm to 10 μm.

As shown in FIG. 3, the edge part 24 of the bottom wall 20 of each trapezoidal trench 17 is formed to have a shape curved outwardly from the trapezoidal trench 17, and a bottom part of each trapezoidal trench 17 is formed to have the shape of the letter U when viewed cross-sectionally. The curvature radius R of the inner surface (curved plane) of the edge part 24 shaped in this way satisfies the following formula (1).

$$0.01L < R < 10L \quad (1)$$

In Formula (1), L designates a linear distance between the edge parts 24 facing each other along the width direction of the trench 17 (no specific limitations are imposed on the unit if it is a unit of length such as μm, nm, or m). More specifically, it is the width of the bottom surface 19 parallel to the surface 12 of the SiC epitaxial layer 6, and is a value obtained by subtracting the width of the edge part 24 from the width W of the trench 17.

Preferably, the curvature radius R of the edge part 24 satisfies the following formula (2):

$$0.02L < R < 1L \quad (2)$$

The curvature radius R can be found, for example, by photographing the cross section of the trapezoidal trench 17 with a SEM (Scanning Electron Microscope) and by measuring the curvature of the edge part 24 of a resulting SEM image.

A p type layer 23 serving as an electric-field-moderating portion is formed along an inner surface of the trapezoidal trench 17 so as to be exposed to the inner surface at the bottom wall 20 and the side wall 22 of the trapezoidal trench 17. The p type layer 23 is formed from the bottom wall 20 of the trapezoidal trench 17 to an opening end of the trapezoidal trench 17 via the edge part 24. The p type layer 23 forms a pn junction portion between the n type SiC epitaxial layer 6 and the p type layer 23. As a result, a pn diode 25 composed of the p type layer 23 and the n type SiC epitaxial layer 6 (low-resistance drift layer 9) is built in the Schottky barrier diode 1.

As shown in FIG. 3, in the thickness of the p type layer 23 (i.e., depth from the inner surface of the trapezoidal trench 17), a first thickness $t_5$ from the bottom surface 19 of the trapezoidal trench 17 measured in the depth direction of the trapezoidal trench 17 (i.e., direction perpendicular to the surface 12 of the SiC epitaxial layer 6) is greater than a second thickness $t_6$ from the side surface 21 of the trapezoidal trench 17 measured in the width direction of the trapezoidal trench 17 (i.e., direction parallel to the surface 12 of the SiC epitaxial layer 6). More specifically, the first thickness $t_5$ is, for example, 0.3 μm to 0.7 μm, and the second thickness $t_6$ is, for example, 0.1 μm to 0.5 μm.

The p type layer 23 has a $p^+$ type contact portion 26 into which impurities have been implanted at a higher concentration than other parts of the p type layer 23 at a part of the bottom wall 20 of the trapezoidal trench 17. For example, the impurity concentration of the contact portion 26 is $1 \times 10^{20}$ to $1 \times 10^{21}$ cm$^{-3}$, and the impurity concentration of other parts of the electric-field-moderating portion excluding the contact portion 26 is $1 \times 10^{17}$ to $5 \times 10^{18}$ cm$^{-3}$.

The contact portion 26 is formed linearly along the longitudinal direction of the trapezoidal trench 17, and has a depth (e.g., 0.05 μm to 0.2 μm) from the bottom surface 19 of the trapezoidal trench 17 to a halfway point in the depth direction of the p type layer 23.

An anode electrode 27 serving as a Schottky electrode is formed on the field insulating film 16.

The anode electrode 27 includes a first electrode 28 formed at a top of each unit cell 18 and a second electrode 29 that straddles between the adjoining trapezoidal trenches 17 and that is formed so as to cover the first electrode 28 at the top of the unit cell 18 sandwiched between those trapezoidal trenches 17.

The first electrode 28 is formed linearly along the longitudinal direction of the trapezoidal trench 17 in a central part 31 sandwiched between peripheral edges 30 of opening ends of the adjoining trapezoidal trenches 17 at the top of each unit cell 18.

The second electrode 29 is formed so as to cover the whole of the active region 13, and is embedded in each trapezoidal trench 17. Additionally, the second electrode 29 projects in a flange-like manner outwardly from the opening 14 so as to cover the peripheral edge of the opening 14 in the field insulating film 16 from above. In other words, the peripheral edge of the field insulating film 16 is sandwiched between the upper and lower sides over the entire perimeter by means of the SiC epitaxial layer 6 (obverse-surface drift layer 10) and the second electrode 29. Therefore, the outer peripheral area of Schottky junction in the SiC epitaxial layer 6 (i.e., inner edge of the field region 15) is covered with the peripheral edge of the field insulating film 16 made of SiC.

An annular trench 32 that penetrates the obverse-surface drift layer 10 from the surface 12 of the SiC epitaxial layer 6 and that has its deepest part reaching a halfway part of the low-resistance drift layer 9 is formed on the side of the surface 12 of the SiC epitaxial layer 6 in the field region 15. The annular trench 32 is formed such that a plurality of trenches surrounding the active region 13 are arranged parallel with each other at intervals. The interval between the annular trenches 32 adjoining each other is set to become greater in proportion to an approach to a far side from a near side with respect to the active region 13. As a result, the width of a part sandwiched between the annular trenches 32 adjoining each other becomes greater in proportion to an approach to the far side from the near side with respect to the active region 13.

A p type layer 49 is formed on a bottom wall 50 and a side wall 51 of the annular trench 32 along an inner surface of the annular trench 32 so as to be exposed to this inner surface. The p type layer 49 is formed from the bottom wall 50 of the annular trench 32 to an opening end of the annular trench 32 via an edge part 52 at both ends in the width direction of the bottom wall 50 in the same way as the p type layer 23.

This p type layer 49 is formed at the same step as the p type layer 23, and has the same impurity concentration (e.g., $1 \times 10^{17}$ to $5 \times 10^{18}$ cm$^{-3}$) and the same thickness as the p type layer 23.

A surface protection film 33 made of, for example, silicon nitride (SiN) is formed on the topmost surface of the Schottky barrier diode 1. An opening 34 by which the anode electrode 27 (second electrode 29) is exposed is formed at a central part of the surface protection film 33. A bonding wire etc., are bonded to the second electrode 29 through this opening 34.

In the Schottky barrier diode 1, a forward bias state is reached in which a positive voltage is applied to the anode electrode 27 and in which a negative voltage is applied to the cathode electrode 4, and, as a result, electrons (carriers) move from the cathode electrode 4 to the anode electrode 27 through the active region 13 of the SiC epitaxial layer 6, and an electric current flows.

In the Schottky barrier diode 1, its threshold voltage $V_{th}$ is 0.3V to 0.7V, and its leakage current $J_r$ in the rated voltage $V_R$ is $1 \times 10^{-9}$ A/cm$^2$ to $1 \times 10^{-4}$ A/cm$^2$.

The threshold voltage $V_{th}$ can be found, for example, from a voltage value indicated by an intersection between an extension line of a linear part of an I-V curve and the X axis in a graph (X axis: voltage, Y axis: electric current) showing I-V characteristics of the Schottky barrier diode 1.

The rated voltage $V_R$ is, for example, 50 to 90% of a breakdown voltage $V_B$, and the breakdown voltage $V_B$ can be found by the following formula (3). In the present embodiment, the breakdown voltage $V_B$ is 700 V or more (specifically, 700 V to 3000 V).

[Numerical Formula 1]

$$V_{BR} = \sqrt{\frac{W\varepsilon E^3}{4qN}} \quad (3)$$

(In Formula (3), W designates the thickness of the SiC epitaxial layer 6, E designates the insulation breakdown electric field strength of the SiC epitaxial layer 6, q designates elementary charge, and N designates the impurity concentration of the SiC epitaxial layer 6.)

The on-resistance $R_{on} \cdot A$ of the Schottky barrier diode 1 is 0.3 mΩ·cm$^2$ to 3 mΩ·cm$^2$.

The fact that the Schottky barrier diode 1 of the present embodiment has the threshold voltage $V_{th}$ and the leakage current $J_r$ falling within the aforementioned range can be proven by the following item <Introduction Effect of Trench Structure>.

<Introduction Effect of Trench Structure>

Figure 4:
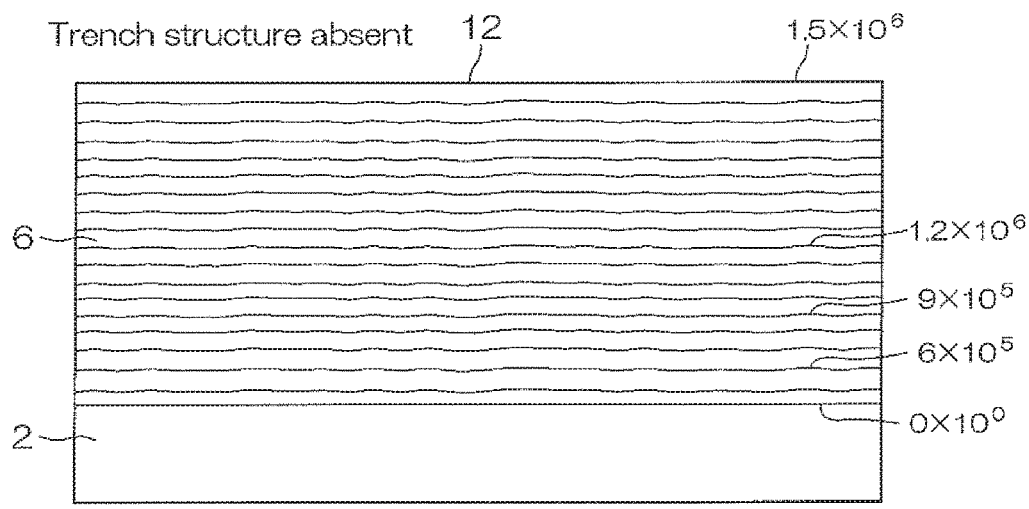
FIG. 4 is a distribution view (simulation data) of electric field strength when a reverse voltage is applied, showing a case in which a trench structure is absent.
Figure 5:
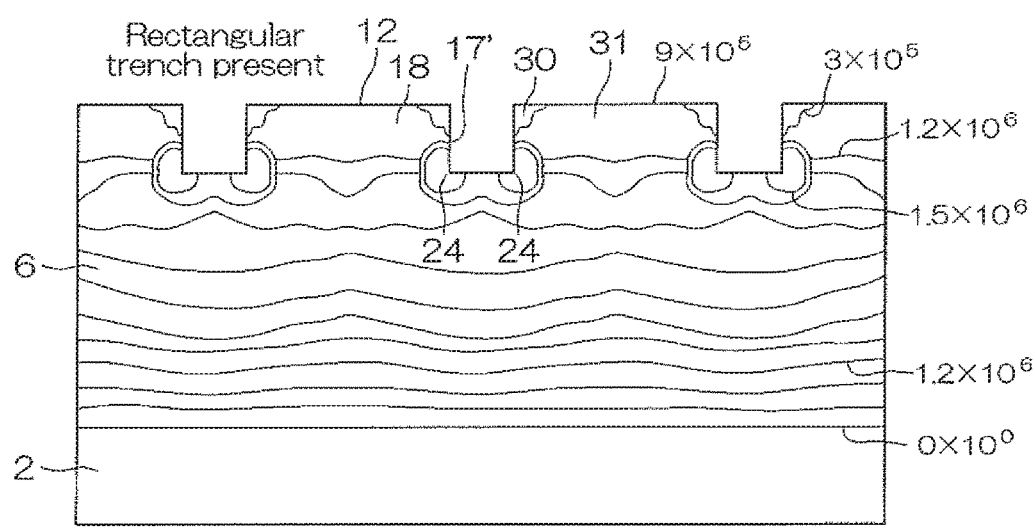
FIG. 5 is a distribution view (simulation data) of electric field strength when a reverse voltage is applied, showing a case in which a rectangular trench structure is present.
Figure 6:
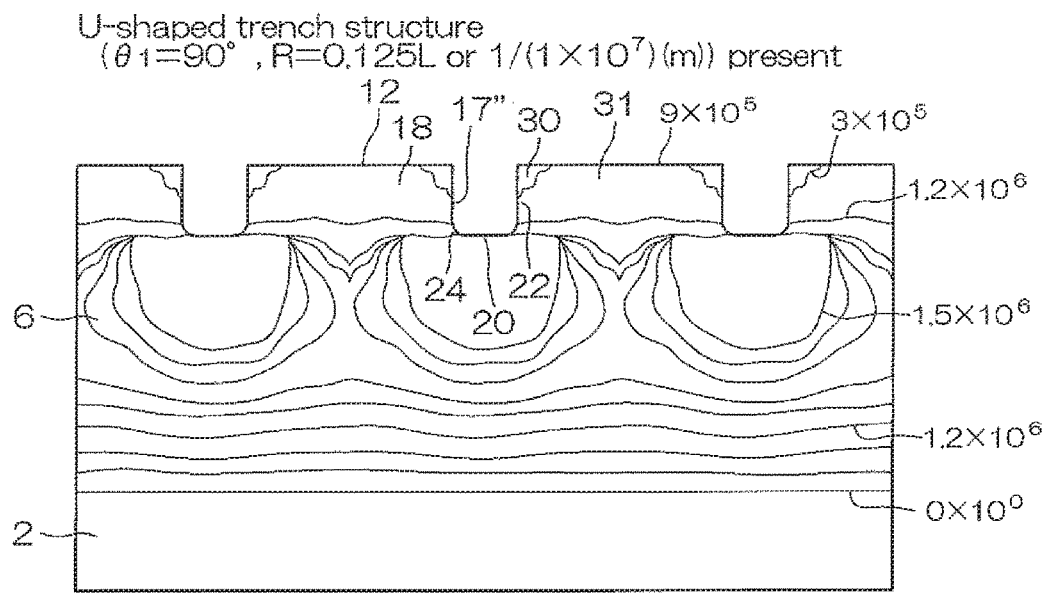
FIG. 6 is a distribution view (simulation data) of electric field strength when a reverse voltage is applied, showing a case in which a U-shaped trench structure is present.

Referring to FIG. 4 to FIG. 15, a description will be given of a reduction effect of the reverse leakage current $J_r$ and the threshold voltage $V_{th}$ brought about by forming the trapezoidal trench 17 and the p type layer 23 in the SiC epitaxial layer 6. It should be noted that the trench of FIG. 5 is a rectangular trench 17', and the trench of FIG. 6 is a U-shaped trench 17".

Figure 7:
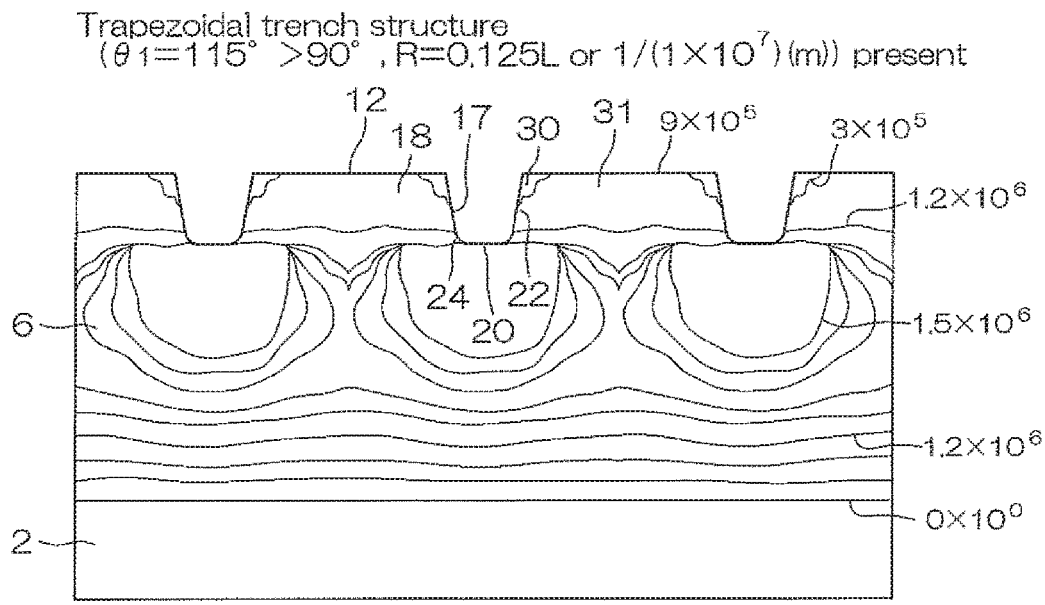
FIG. 7 is a distribution view (simulation data) of electric field strength when a reverse voltage is applied, showing a case in which a trapezoidal trench structure is present.
Figure 8:
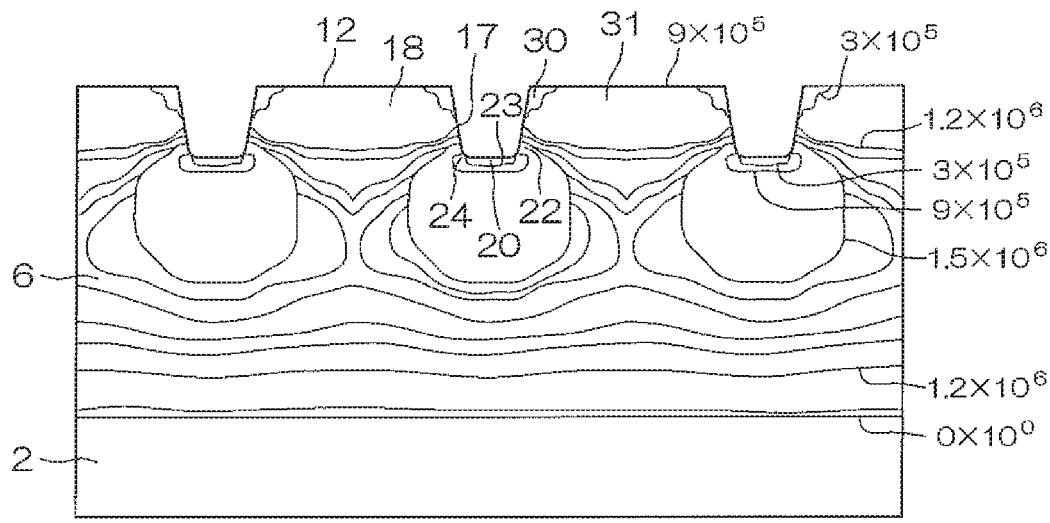
FIG. 8 is a distribution view (simulation data) of electric field strength when a reverse voltage is applied, showing a case in which a trapezoid trench structure+a bottom-wall p type layer are present.
Figure 9:
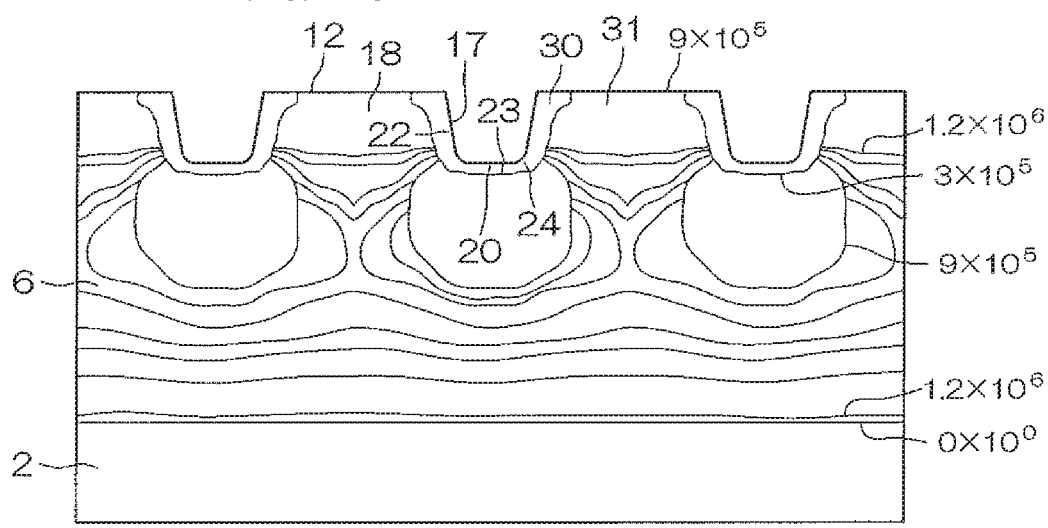
FIG. 9 is a distribution view (simulation data) of electric field strength when a reverse voltage is applied, showing a case in which a trapezoid trench structure+a side-wall p type layer is present.

FIG. 4 to FIG. 9 are distribution views (simulation data) of electric field strength when a reverse voltage is applied, FIG. 4 showing a case in which a trench structure is absent, FIG. 5 showing a case in which a rectangular trench structure is present, FIG. 6 showing a case in which a U-shaped trench structure ($\theta_1 = 90°$, R=0.125 L or $1/(1 \times 10^7)$(m)) is present, FIG. 7 showing a case in which a trapezoidal trench structure ($\theta_1 = 115° > 90°$, R=0.125 L or $1/(1 \times 10^7)$(m)) is present, FIG. 8 showing a case in which a trapezoidal trench structure ($\theta_1 = 115° > 90°$, R=0.125 L or $1/(1 \times 10^7)$(m))+a bottom-wall p type layer are present, FIG. 9 showing a case in which a trapezoidal trench structure ($\theta_1 = 115° > 90°$, R=0.125 L or $1/(1 \times 10^7)$(m))+a side-wall p type layer are present. In FIG. 4 to FIG. 9, the same reference sign as in FIGS. 1A, 1B, 2, and 3 are given to a component equivalent to each component shown in FIGS. 1A, 1B, 2, and 3.

First, the structures of FIG. 4 to FIG. 9 were designed as follows.

n$^+$ type SiC substrate 2: $1 \times 10^{19}$ cm$^{-3}$ in concentration, 1 μm in thickness n$^-$ type SiC epitaxial layer 6: $1 \times 10^{16}$ cm$^{-3}$ in concentration, 5 μm in thickness Trenches 17, 17', and 17": 1.05 μm in depth Curvature radius R of edge part 24 of bottom wall 20:

p type layer 23: $1 \times 10^{18}$ cm$^{-3}$ in concentration

Thereafter, the electric field strength distribution in the SiC epitaxial layer 6 was simulated when a reverse voltage (600 V) was applied to an anode-to-cathode interval of the Schottky barrier diode 1 having each of the structures of FIG. 4 to FIG. 9. A TCAD (product name) made by Synopsys, Inc. was used as a simulator.

As shown in FIG. 4, it has been recognized that no trench structure having a shape is formed, and, in the Schottky barrier diode in which the surface 12 of the SiC epitaxial layer 6 is flat, the electric field strength becomes greater in proportion to an approach to the surface 12 from the reverse surface 11 of the SiC epitaxial layer 6, and reaches the maximum (about $1.5 \times 10^6$ V/cm) at the surface 12 of the SiC epitaxial layer 6.

Additionally, as shown in FIG. 5, it has been recognized that, in the Schottky barrier diode in which a rectangular trench structure having a sharply shaped edge part 24 is formed, the electric field strength at a part (unit cell 18) sandwiched between the rectangular trenches 17' adjoining each other is weakened by forming the structure of the rectangular trench 17' (the electric field strength at the central part 31 of the unit cell 18 is about $9 \times 10^5$ V/cm), and an intense electric field of about $1.5 \times 10^6$ V/cm is concentrated on the edge part 24 of the bottom wall 20 of the rectangular trench 17'.

On the other hand, as shown in FIG. 6 and FIG. 7, it has been recognized that, in the Schottky barrier diode in which the structures of the U-shaped trench 17" and the trapezoidal trench 17 are formed and in which the P type layer 23 is not formed on the inner walls of these trenches 17 and 17", the electric field strength of a part (unit cell 18) sandwiched between the trapezoidal trenches 17 adjoining each other is weakened by forming the structures of the trenches 17 and 17", and a part in which the electric field strength reaches the maximum is shifted to the whole of the bottom wall 20 of the trapezoidal trench 17. More specifically, the electric field strength of the central part 31 of the unit cell 18 was weakened to about $9 \times 10^5$ V/cm, and the electric field strength of the peripheral edge 30 of the unit cell 18 was weakened to about $3 \times 10^5$ V/cm, and the electric field strength of the whole of the bottom wall 20 of the trapezoidal trench 17 reached the maximum showing about $1.5 \times 10^6$ V/cm. In other words, it has been recognized that the local concentration of an electric field on the edge part 24 can be moderated.

Therefore, even if a barrier height between the SiC epitaxial layer 6 and the anode electrode 27 (Schottky electrode) contiguous to the surface 12 (surface of the unit cell 18) of the SiC epitaxial layer 6 is lowered and a reverse voltage closer to a breakdown voltage is applied, the electric field strength of a part in which this barrier height is formed is weak, and therefore it has been recognized that the absolute amount of reverse leakage current $J_r$ that exceeds this barrier height can be reduced. As a result, it has been recognized that the threshold voltage $V_{th}$ can be reduced by lowering the barrier height while the reverse leakage current $J_r$ can be reduced.

On the other hand, a part (generation source of a leakage current) on which an electric field is concentrated in the SiC epitaxial layer 6 is shifted to the bottom part of trenches 17 and 17" by forming the U-shaped trench 17" and the trapezoidal trench 17. It has been recognized that, in the Schottky barrier diode in which the p type layer 23 is formed on the edge part 24 and the bottom wall 20 of the trapezoidal trench 17, the electric field strength of the bottom wall 20 of the trapezoidal trench 17 is weakened, and the part in which the electric field strength reaches the maximum is shifted to the side wall 22 of the trapezoidal trench 17 as shown in FIG. 8. More specifically, the electric field strength of the bottom wall 20 of the trapezoidal trench 17 was weakened to $3 \times 10^5$ V/cm or less, and the electric field strength of the lower part of the side wall 22 of the trapezoidal trench 17 was $1.5 \times 10^6$ V/cm showing the maximum.

In the Schottky barrier diode of FIG. 9 that has the same arrangement as that of FIGS. 1A, 1B, and 2, it has been recognized that the electric field strength of the side wall 22 of the trapezoidal trench 17 is weakened by the p type layer 23 also formed on the side wall 22 of the trapezoidal trench 17, and the part on which an electric field is concentrated is placed away from the inner wall of the trapezoidal trench 17. More specifically, the electric field strength of the side wall 22 of the trapezoidal trench 17 was weakened to $3 \times 10^5$ V/cm or less, and an area having an electric field strength of $1.5 \times 10^6$ V/cm was absent around the inner wall of the trapezoidal trench 17.

Thereafter, a relationship between a threshold voltage $V_{th}$ and a reverse leakage current $J_r$ flowing when a voltage of 600 V is applied was examined by use of a Schottky barrier diode (see FIG. 2) having a trench structure, a Schottky barrier diode (see FIG. 10) having a JBS (Junction Barrier Schottky) structure, a Schottky barrier diode (see FIG. 11) having a pseudo-JBS structure, and a Schottky barrier diode (see FIG. 12) having a planar structure.

Figure 10:
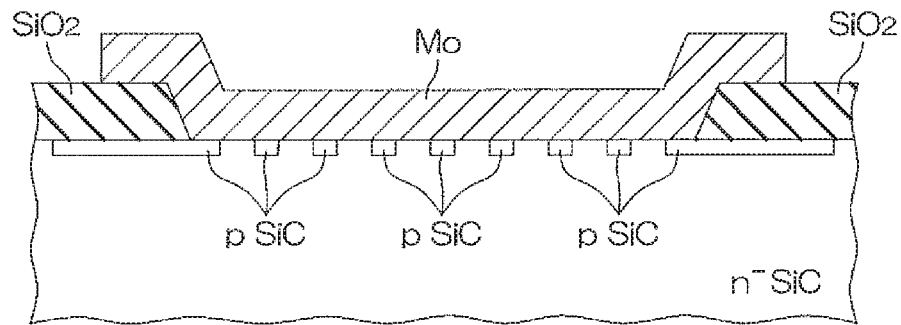
FIG. 10 is a schematic sectional view of a Schottky barrier diode that has a JBS structure.

The Schottky barrier diode of FIG. 10 (JBS structure) was produced as follows.

First, an n⁻ type SiC epitaxial layer (concentration=$1 \times 10^{16}$ cm⁻³, thickness T=5 μm) was allowed to grow on an n⁺ type SiC substrate (concentration=$1 \times 10^{19}$ cm⁻³, thickness=250 μm, chip size=1.75 mm□), and then aluminum (Al) ions were implanted in a multi-stage manner from the surface of the SiC epitaxial layer toward the inside through a hard mask (SiO₂) that was subjected to patterning into a predetermined shape at implanting energy=360 keV, dose amount=$2.0 \times 10^{12}$ cm⁻², implanting energy=260 keV, dose amount=$1.5 \times 10^{13}$ cm⁻², implanting energy=160 keV, dose amount=$1.0 \times 10^{13}$ cm⁻², implanting energy=60 keV, dose amount=$2.0 \times 10^{15}$ cm⁻², implanting energy=30 keV, and dose amount=$1.0 \times 10^{15}$ cm⁻². Thereafter, the SiC epitaxial layer underwent heat-treatment (annealing treatment) for three minutes at 1775° C. As a result, a guard ring and a JBS structure made of p type SiC were simultaneously formed on a surface layer part of the SiC epitaxial layer. Thereafter, a field insulating film (SiO₂ thickness=15000 Å) was formed on the surface of the SiC epitaxial layer, and was subjected to patterning so that an active region having a predetermined size was exposed, and then an anode electrode (Mo) was formed. After forming the anode electrode, a cathode electrode was formed on the reverse surface of the SiC substrate.

Figure 11:
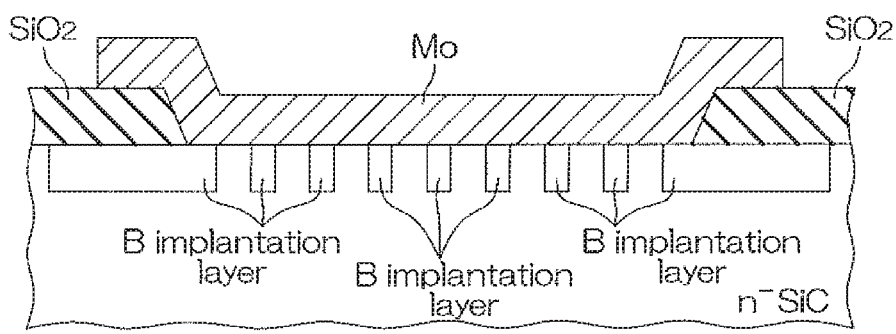
FIG. 11 is a schematic sectional view of a Schottky barrier diode that has a pseudo-JBS structure.

The Schottky barrier diode (pseudo-JBS structure) of FIG. 11 has a high-resistance pseudo-JBS structure (B implantation layer) in which the activation rate of boron ions is less than 5%. The Schottky barrier diode (pseudo-JBS structure) is produced by using boron (B) as an impurity instead of Al, and performing annealing treatment such a temperature (less than 1500° C.) as not to activate implanted impurity ions while defect caused by a collision of implanted impurity ions in the crystal structure of a wide bandgap semiconductor are recovered (crystallinity recovery).

Figure 12:
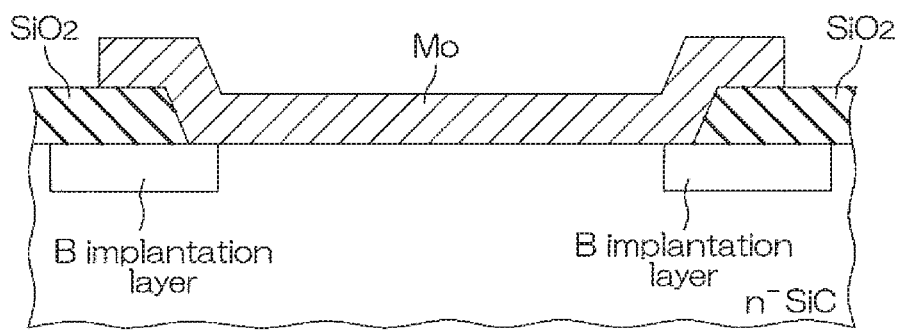
FIG. 12 is a schematic sectional view of a Schottky barrier diode that has a planar structure.

The Schottky barrier diode (planar) of FIG. 12 can be produced through the same step as the Schottky barrier diode of FIG. 11 except that a step of forming a pseudo-JBS structure is not performed.

Figure 13:
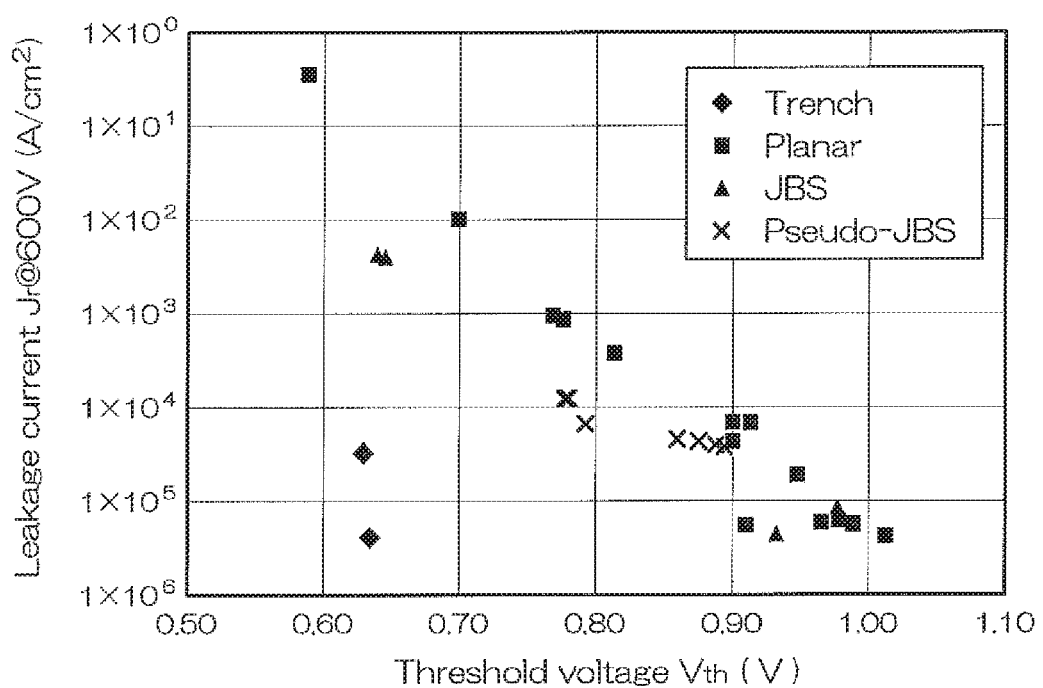
FIG. 13 is a graph showing a relationship between a threshold voltage $V_{th}$ and a leakage current $J_r$ of each Schottky barrier diode.
Figure 14:
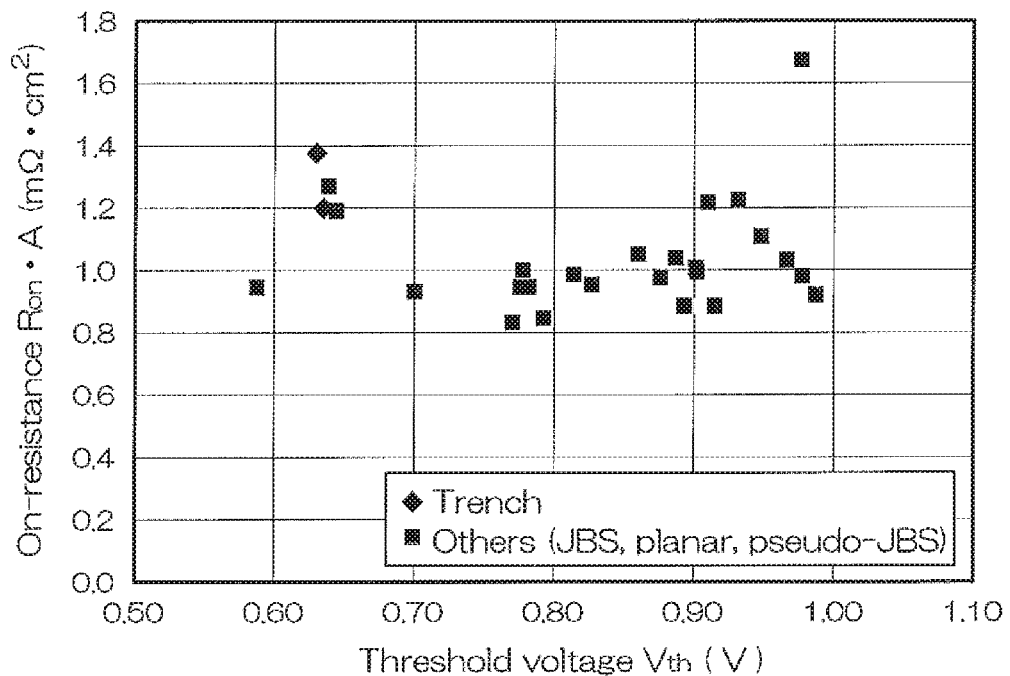
FIG. 14 is a graph showing a relationship between a threshold voltage $V_{th}$ and on-resistance $R_{on}$ of each Schottky barrier diode.
Figure 15:
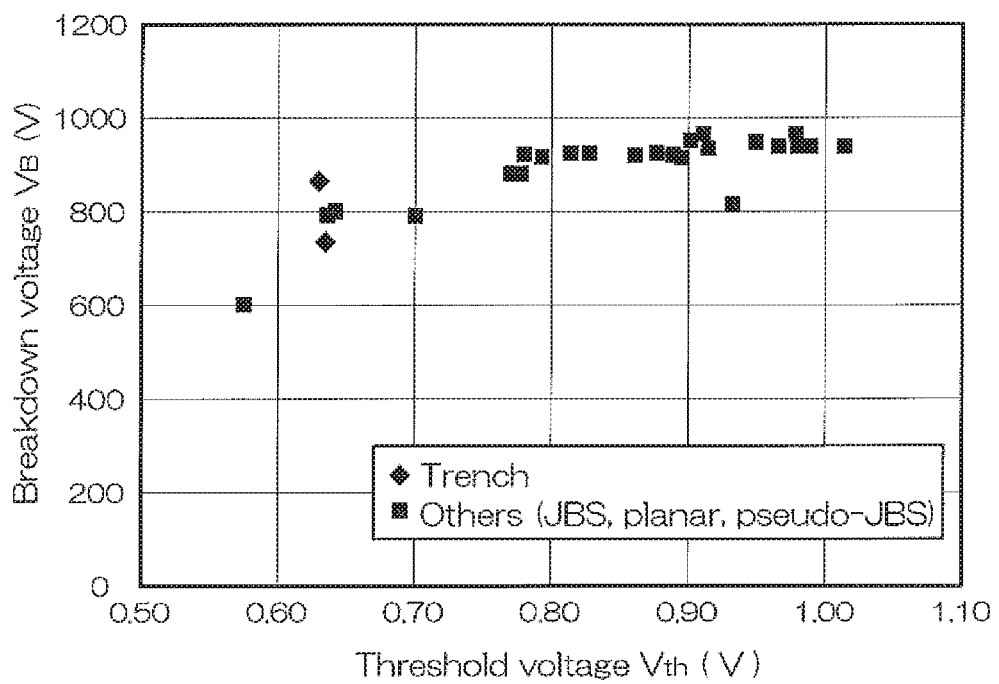
FIG. 15 is a graph showing a relationship between a threshold voltage $V_{th}$ and a breakdown voltage $V_B$ of each Schottky barrier diode.

A relationship among the threshold voltage $V_{th}$, the reverse leakage current $J_r$, the on-resistance $R_{on} \cdot A$, and the breakdown voltage $V_B$ of each Schottky barrier diode is shown in FIG. 13 to FIG. 15. A specific value of each characteristic is shown in the following table 1.

TABLE 1

| | Threshold voltage $V_{th}$ (V) | On-resistance $R_{on} \cdot A$ (mΩ·cm²) | Leakage current density Jr (A/cm²) | Breakdown voltage $V_{BR}$ (V) | Chip size | Active size |
|---|---|---|---|---|---|---|
| JBS | 0.930 | 1.23 | $4.48 \times 10^{-6}$ | 822 | 1.1 × 1.38 mm | 1.116 mm² × 2 |
| JBS | 0.976 | 1.68 | $8.73 \times 10^{-6}$ | 971 | 1.87 mm□ | 2.657 mm² |
| JBS | 0.637 | 1.28 | $4.22 \times 10^{-3}$ | 801 | 1.75 mm□ | 2.28 mm² |
| JBS | 0.642 | 1.20 | $4.04 \times 10^{-3}$ | 805 | 1.75 mm□ | 2.28 mm² |
| Planar | 0.909 | 1.22 | $5.33 \times 10^{-6}$ | 970 | 1.84 mm□ | 2.28 mm² |
| Planar | 1.012 | 0.98 | $4.16 \times 10^{-6}$ | 951 | 1.75 mm□ | 2.28 mm² |
| Planar | 0.947 | 1.12 | $1.85 \times 10^{-5}$ | 956 | 1.75 mm□ | 2.28 mm² |
| Planar | 0.965 | 1.04 | $5.77 \times 10^{-6}$ | 950 | 1.75 mm□ | 2.28 mm² |
| Planar | 0.977 | 0.99 | $6.32 \times 10^{-6}$ | 948 | 1.75 mm□ | 2.28 mm² |
| Planar | 0.987 | 0.93 | $5.54 \times 10^{-6}$ | 951 | 1.75 mm□ | 2.28 mm² |
| Planar | 0.901 | 1.00 | $6.87 \times 10^{-5}$ | 961 | 1.75 mm□ | 2.28 mm² |
| Planar | 0.900 | 1.01 | $4.13 \times 10^{-5}$ | 956 | 1.75 mm□ | 2.28 mm² |
| Planar | 0.913 | 0.89 | $6.84 \times 10^{-5}$ | 946 | 1.75 mm□ | 2.28 mm² |
| Planar | 0.813 | 0.99 | $3.91 \times 10^{-4}$ | 930 | 1.75 mm□ | 2.28 mm² |
| Planar | 0.776 | 1.01 | $8.76 \times 10^{-4}$ | 890 | 1.75 mm□ | 2.28 mm² |
| Planar | 0.769 | 0.83 | $9.56 \times 10^{-4}$ | 888 | 1.75 mm□ | 2.28 mm² |
| Planar | 0.587 | 0.95 | $3.46 \times 10^{-1}$ | 608 | 1.75 mm□ | 2.28 mm² |
| Planar | 0.698 | 0.93 | $1.02 \times 10^{-2}$ | 798 | 1.75 mm□ | 2.28 mm² |
| Pseudo-JBS | 0.776 | 0.96 | $1.30 \times 10^{-4}$ | 891 | 1.75 mm□ | 2.28 mm² |

TABLE 1-continued

|  | Threshold voltage $V_{th}$ (V) | On-resistance $R_{on} \cdot A$ (m$\Omega \cdot$ cm$^2$) | Leakage current density Jr (A/cm$^2$) | Breakdown voltage $V_{BR}$ (V) | Chip size | Active size |
|---|---|---|---|---|---|---|
| Pseudo-JBS | 0.792 | 0.85 | $6.93 \times 10^{-5}$ | 923 | 1.75 mm□ | 2.28 mm$^2$ |
| Pseudo-JBS | 0.779 | 0.96 | $1.30 \times 10^{-4}$ | 926.7 | 1.75 mm□ | 2.28 mm$^2$ |
| Pseudo-JBS | 0.875 | 0.99 | $4.35 \times 10^{-5}$ | 931.1 | 1.75 mm□ | 2.28 mm$^2$ |
| Pseudo-JBS | 0.859 | 1.06 | $4.69 \times 10^{-5}$ | 929.2 | 1.75 mm□ | 2.28 mm$^2$ |
| Pseudo-JBS | 0.887 | 1.04 | $3.93 \times 10^{-5}$ | 928.6 | 1.75 mm□ | 2.28 mm$^2$ |
| Pseudo-JBS | 0.894 | 0.89 | $3.81 \times 10^{-5}$ | 922.7 | 1.75 mm□ | 2.28 mm$^2$ |
| Trench | 0.629 | 1.38 | $3.30 \times 10^{-5}$ | 870 | 1.75 mm□ | 2.28 mm$^2$ |
| Trench | 0.634 | 1.21 | $4.06 \times 10^{-6}$ | 741 | 1.75 mm□ | 2.28 mm$^2$ |

From FIG. 13 to FIG. 15 and Table 1, it has been recognized that the leakage current $J_r$ has a tendency to rise when the threshold voltage $V_{th}$ is lowered if the on-resistance $R_{on} \cdot A$ is at the same level in the Schottky barrier diodes having a JBS structure, a planar structure, and a pseudo-JBS structure, whereas the leakage current $J_r$ is kept at a small value even if the threshold voltage $V_{th}$ is lowered in the Schottky barrier diode having the trench structure of the present embodiment.

From these results, it has been recognized that a reverse leakage current $J_r$ of the whole of the Schottky barrier diode 1 can be reliably reduced in the Schottky barrier diode 1 shown in FIGS. 1A, 1B, and 2. In other words, in the Schottky barrier diode 1 having the structure of FIGS. 1A, 1B, and 2, a reverse leakage current $J_r$ can be reliably reduced even if a reverse voltage closer to a breakdown voltage $V_B$ is applied, and therefore the pressure resistance of a wide bandgap semiconductor can be satisfactorily utilized.

As a result, the threshold voltage $V_{th}$ can be set at 0.3 V to 0.7 V, and the leakage current $J_r$ in the normal rated voltage $V_R$ can be set at $1 \times 10^{-9}$ A/cm$^2$ to $1 \times 10^{-4}$ A/cm$^2$, and therefore a current-carrying loss can be reduced to be equal to or to be smaller than that of an Si-pn diode while a switching loss can be smaller than the Si-pn diode. As a result, it is built in a power module for use in, for example, an inverter circuit that forms a driving circuit to drive an electric motor used as a power source for electric vehicles (including hybrid automobiles), trains, industrial robots, etc., and hence it is possible to achieve a power module that is high in withstanding pressure and that is low in loss.

Moreover, there is a possibility that the side wall 22 of the trapezoidal trench 17 will be damaged during etching, and a Schottky barrier cannot be formed between the side wall 22 and the anode electrode 27 according to predetermined design when the trapezoidal trench 17 is formed by dry etching as at a step of FIG. 20C described later. Therefore, in the Schottky barrier diode 1 of the present embodiment, the surface 12 of the SiC epitaxial layer 6 that is covered with a hard mask 35 (described later) and that is protected (step of FIG. 20B described later) is used chiefly as a Schottky interface during etching, and a p type layer 23 is formed on the damaged side wall 22. As a result, the side wall 22 of the trapezoidal trench 17 can be used effectively. Additionally, a pn junction having a high barrier is formed at a part in the side wall 22 of the trapezoidal trench 17 that has a high electric field strength, and hence the leakage current $J_r$ can be reduced.

<Effect of Built-in SiC-Pn Diode>

Next, referring to FIG. 16, a description will be given of an effect when a contact portion 26 is formed at the p type layer 23 and when a pn diode 25 is built in the SiC epitaxial layer 6.

Figure 16:
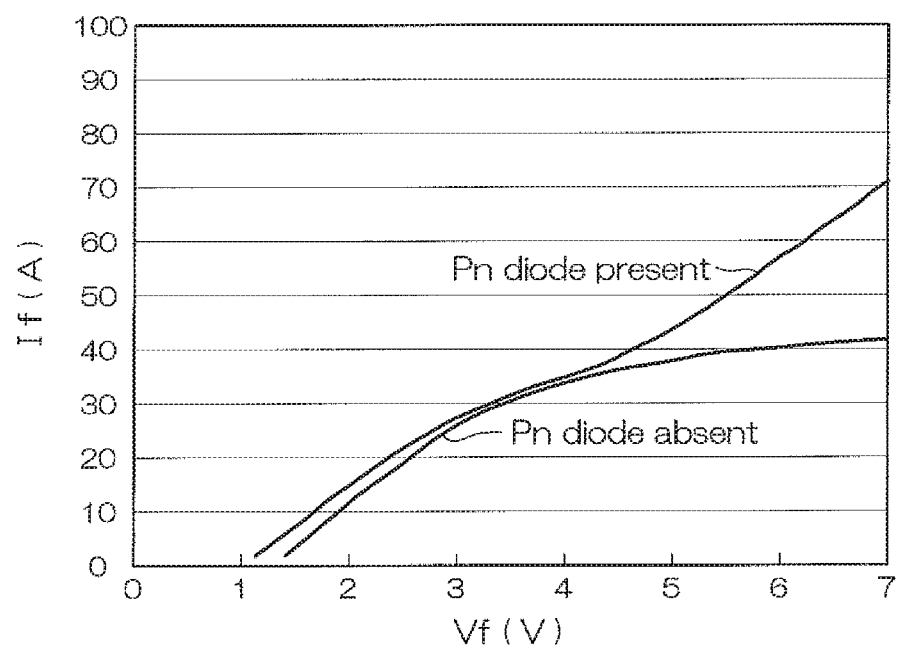
FIG. 16 is a graph showing a current-voltage (I-V) curve of a built-in pn junction portion.

FIG. 16 is a graph showing a current-voltage (I-V) curve of a built-in pn junction portion.

A current-carrying test was made by applying a forward voltage to the Schottky barrier diode having the structure of FIGS. 1A, 1B, and 2 while varying the forward voltage from 1 V to 7 V. Additionally, the amount of variation of an electric current flowing to the pn junction portion of the Schottky barrier diode when the applied voltage is varied from 1 V to 7 V was evaluated.

On the other hand, the same current-carrying test as above was made with respect to a Schottky barrier diode having the same structure as that of FIGS. 1A, 1B, and 2 except that the contact portion 26 of the p type layer 23 is not formed, and the amount of variation of an electric current flowing to the pn junction portion was evaluated.

As shown in FIG. 16, in the pn junction portion in which the contact portion 26 is not formed at the p type layer 23, the electric current was substantially constant almost without being increased approximately from a point at which the applied voltage exceeds 4 V.

On the other hand, in the Schottky barrier diode in which the contact portion 26 is formed at the p type layer 23 and that has the built-in pn diode 25, the increasing rate of an electric current from a point at which the applied voltage exceeds 4 V rose more rapidly than the increasing rate to 4 V or less.

As a result, it has been recognized that, in FIGS. 1A, 1B, and 2, if the anode electrode 27 (Schottky electrode) is kept in ohmic contact with the pn diode 25 disposed in parallel in the Schottky barrier diode 1, part of the surge current can be allowed to flow to the built-in pn diode 25 by turning the built-in pn diode 25 on even if a large surge current flows to the Schottky barrier diode. As a result, it has been recognized that the surge current flowing to the Schottky barrier diode 1 can be reduced, and therefore the Schottky barrier diode 1 can be prevented from being thermally broken down by the surge current.

<Two Schottky Electrodes (First Electrode and Second Electrode)>

Next, referring to FIG. 17 and FIG. 18, a description will be given of efficiency improvement of a reduction in the reverse leakage current $J_r$ and in the threshold voltage $V_{th}$ by being provided with two Schottky electrodes (first electrode 28 and second electrode 29).

Figure 17:
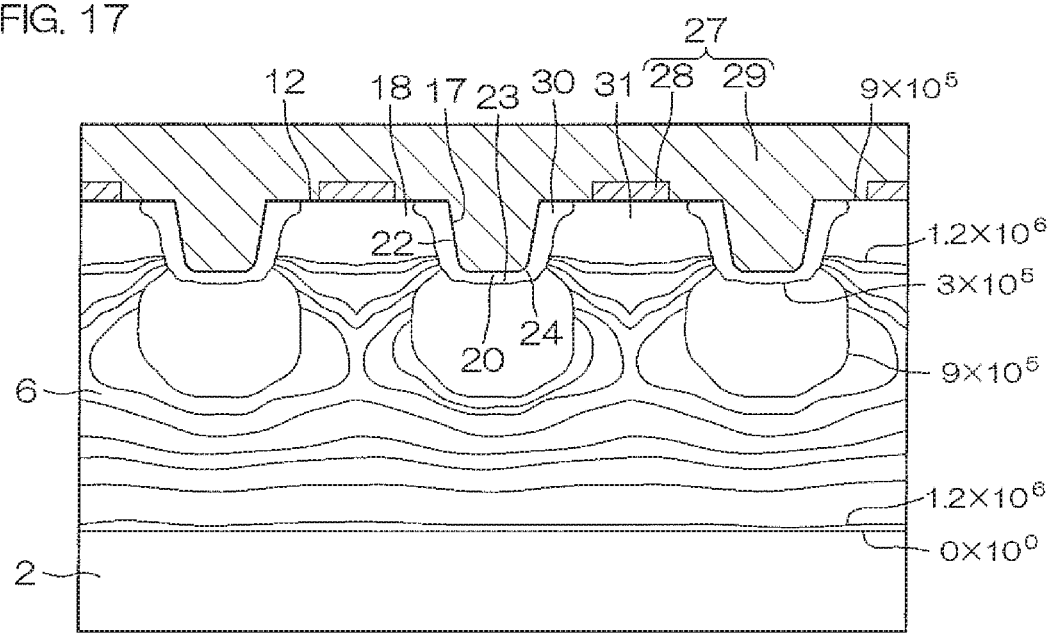
FIG. 17 is an enlarged view of a main part of the distribution view of the electric field strength shown in FIG. 9, in which a part near the trench of the Schottky barrier diode is enlarged.

FIG. 17 is an enlarged view of a main part of the distribution view of the electric field strength shown in FIG. 9, in which a part near the trench of the Schottky barrier diode is enlarged. FIG. 18 is a graph showing the electric field strength distribution in a surface of a unit cell of the Schottky barrier diode shown in FIG. 17.

As described above, in the Schottky barrier diode 1 of the present embodiment, the electric field strength of the unit cell 18 in the surface 12 can be weakened by forming the trapezoidal trench 17 and by forming the p type layer 23 on the bottom wall 20 and the side wall 22 of the trapezoidal trench 17. Therefore, there is a case in which a part having a relatively high electric field strength and a part having a relatively low electric field strength are present like a relationship between the central part 31 and the peripheral edge 30 of the unit cell 18 although the electric field strength distributed on the surface 12 of the unit cell 18 does not cause an increase in the reverse leakage current $J_r$ as an absolute value.

More specifically, as shown in FIG. 17 and FIG. 18, an electric field strength of 0 MV/cm to $8.0 \times 10^5$ MV/cm is distributed on the peripheral edge 30 of the unit cell 18 serving as a first part of the semiconductor layer, and an electric field strength of $8.0 \times 10^5$ MV/cm to $9.0 \times 10^5$ MV/cm is distributed on the central part 31 of the unit cell 18 serving as a second part of the semiconductor layer. In the electric field strength distribution shown when a reverse voltage is applied, the electric field strength (second electric field) of the central part 31 of the unit cell 18 is higher than the electric field strength (first electric field) of the peripheral edge 30 of the unit cell 18.

Therefore, for example, a p type polysilicon that forms a comparatively high potential barrier (e.g., 1.4 eV) is allowed to make a Schottky junction, which serves as the first electrode 28, with the central part 31 of the unit cell 18 to which a relatively high electric field is applied. If the electrode is a semiconductor electrode made of, for example, polysilicon, there is a possibility that semiconductors that differ from each other in bandgap will be connected together according to heterojunction instead of Schottky junction.

On the other hand, for example, aluminum (Al) that forms a comparatively low potential barrier (e.g., 0.7 eV) is allowed to make a Schottky junction, which serves as the second electrode 29, with the peripheral edge 30 of the unit cell 18 to which a relatively low electric field is applied.

As a result, in the central part 31 of the unit cell 18 to which a relatively high electric field is applied when a reverse voltage is applied, a reverse leakage current $J_r$ can be restrained by a high Schottky barrier between the first electrode 28 (polysilicon) and the SiC epitaxial layer 6 (second Schottky barrier).

On the other hand, in the peripheral edge 30 of the unit cell 18 to which a relatively low electric field is applied, even if the height of a Schottky barrier between the second electrode 29 (aluminum) and the SiC epitaxial layer 6 is lowered, there is little fear that a reverse leakage current $J_r$ will flow beyond this Schottky barrier. Therefore, when the Schottky barrier (first Schottky barrier) is made low, an electric current can be allowed to preferentially flow at a low voltage when a forward voltage is applied.

Therefore, it has been recognized that the reverse leakage current $J_r$ and the threshold voltage $V_{th}$ can be efficiently reduced by properly selecting the anode electrode 27 (Schottky electrode) in accordance with the distribution of the electric field strength of the unit cell 18 when a reverse voltage is applied.

<Impurity Concentration of SiC Epitaxial Layer>

Next, referring to FIG. 19, a description will be given of the magnitude of impurity concentration of the SiC substrate 2 and the magnitude of impurity concentration of the SiC epitaxial layer 6.

FIG. 19 is a view to describe the impurity concentration of the SiC substrate and the impurity concentration of the SiC epitaxial layer.

As shown in FIG. 19, each of the SiC substrate 2 and the SiC epitaxial layer 6 is made of an n type SiC that contains n type impurities. The magnitude relationship among impurity concentrations of these components is expressed as SiC substrate 2>buffer layer 7>layers 8 to 10.

The concentration of the SiC substrate 2 is constant, for example, at $5 \times 10^{18}$ to $5 \times 10^{19}$ cm$^{-3}$ along its thickness direction. The concentration of the buffer layer 7 is constant, for example, at $1 \times 10^{17}$ to $5 \times 10^{18}$ cm$^{-3}$ along its thickness direction, or is low along its surface.

The concentrations of the drift layers 8 to 10 vary in a step-by-step manner with each interface of the base drift layer 8, the low-resistance drift layer 9, and the obverse-surface drift layer 10 as a boundary. In other words, there is a concentration difference between the layer on the surface side (12) and the layer on the reverse surface side (11) with respect to each interface.

The concentration of the base drift layer 8 is constant, for example, at $5 \times 10^{14}$ to $5 \times 10^{16}$ cm$^{-3}$ along its thickness direction. The concentration of the base drift layer 8 may be continuously lowered from about $3 \times 10^{16}$ cm$^{-3}$ to about $5 \times 10^{15}$ cm$^{-3}$ in proportion to an approach to the surface from the reverse surface 11 of the SiC epitaxial layer 6 as shown by the broken line of FIG. 19.

The concentration of the low-resistance drift layer 9 is higher than the concentration of the base drift layer 8, and is constant, for example, at $5 \times 10^{15}$ to $5 \times 10^{17}$ cm$^{-3}$ along its thickness direction. The concentration of the low-resistance drift layer 9 may be continuously lowered from about $3 \times 10^{17}$ cm$^{-3}$ to about $5 \times 10^{15}$ cm$^{-3}$ in proportion to an approach to the surface from the reverse surface 11 of the SiC epitaxial layer 6 as shown by the broken line of FIG. 19.

The concentration of the obverse-surface drift layer 10 is lower than the concentration of the base drift layer 8 and the concentration of the low-resistance drift layer 9, and is constant, for example, at $5 \times 10^{14}$ to $1 \times 10^{16}$ cm$^{-3}$ along its thickness direction.

As shown in FIGS. 1A, 1B, and 2, in the unit cell 18 (line cell) partitioned by the stripe-like trapezoidal trench 17, an area (current path) in which an electric current can be allowed to flow is restricted by the width of the pitch P of the trapezoidal trench 17, and therefore there is a fear that the resistance value of the unit cell 18 will rise if the impurity concentration of a part that forms the unit cell 18 in the SiC epitaxial layer 6 is low.

Therefore, as shown in FIG. 19, the concentration of the low-resistance drift layer 9 forming the base part of the unit cell 18 is made higher than the concentration of the base drift layer 8, and, as a result, the resistance value of the unit cell 18 can be restrained from rising by the low-resistance drift layer 9 that has a comparatively high concentration even if the current path is restricted by the pitch P of the trapezoidal trench 17. As a result, the unit cell 18 can be made low in resistance.

On the other hand, the electric field strength to be applied to the surface 12 of the SiC epitaxial layer 6 when a reverse voltage is applied can be reduced by providing the obverse-surface drift layer 10 that has a comparatively low concentration on the surface layer part of the unit cell 18 contiguous to the anode electrode 27 (Schottky electrode). As a result, the reverse leakage current $J_r$ can be made even smaller.

<Method for Forming Trench and P Type Layer>

Next, referring to FIG. 20A to FIG. 20D, a description will be given of a method for forming the trapezoidal trench 17 shown in FIG. 2, which is employed as one example, and the p type layer 23.

FIG. 20A to FIG. 20D are views showing a method for forming the trench shown in FIG. 2 and the p type layer in order of steps.

First, as shown in FIG. 20A, the buffer layer 7, the base drift layer 8, the low-resistance drift layer 9, and the obverse-surface drift layer 10 are subjected to epitaxial growth on the SiC substrate 2 in this order.

Thereafter, as shown in FIG. 20B, a hard mask 35 made of $SiO_2$ is formed on the surface 12 of the SiC epitaxial layer 6 according to, for example, a CVD (Chemical Vapor Deposition) method. Preferably, the thickness of the hard mask 35 is 1 μm to 3 μm. Thereafter, the hard mask 35 is subjected to patterning by a well-known photolithography technique and an etching technique. At this time, etching conditions are set so that the amount (thickness) of etching is 1 to 1.5 times as thick as the thickness of the hard mask 35. More specifically, if the thickness of the hard mask 35 is 1 μm to 3 μm, etching conditions (gas kind, etching temperature) are set so that the amount of etching is 1 μm to 4.5 μm. As a result, the amount of over-etching with respect to the SiC epitaxial layer 6 can be made smaller than a general amount, and therefore an edge part 37 inclined at angle $\theta_1$ (100° to 170°>90°) with respect to the surface 12 of the SiC epitaxial layer 6 can be formed at the lower part of the side wall of the opening 36 of the hard mask 35 that has undergone etching.

Figure 20C:
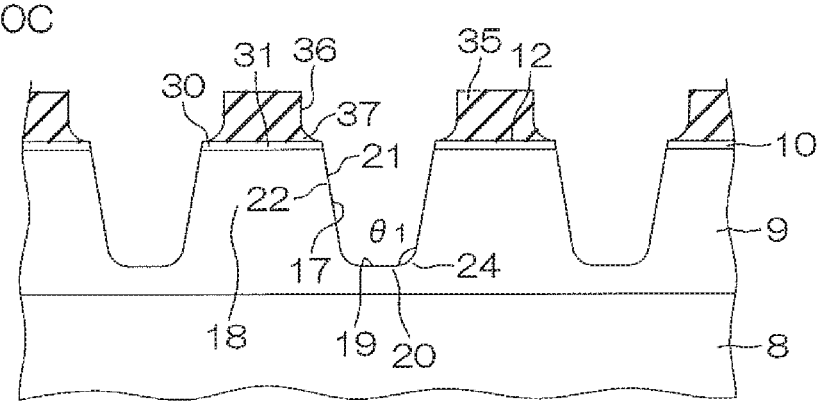
FIG. 20C is a view showing a step following FIG. 20B.

Thereafter, as shown in FIG. 20C, the SiC epitaxial layer 6 is subjected to dry etching from the surface 12 to a depth in which its deepest part reaches a halfway part of the low-resistance drift layer 9 through the hard mask 35, and, as a result, the stripe-like trapezoidal trench 17 is formed. The etching conditions at this time are set at gas kind: $O_2+SF_6+HBr$, Bias: 20 W to 100 W, and Internal pressure of the device: 1 Pa to 10 Pa. As a result, the edge part 24 of the bottom wall 20 can be shaped to be curved. Additionally, the edge part 37 having a predetermined angle $\theta_1$ is formed at the lower part of the side wall of the opening 36 of the hard mask 35, and therefore the side surface 21 of the trapezoidal trench 17 can be inclined at angle $\theta_1$ with respect to the bottom surface 19 of the trapezoidal trench 17.

Figure 20D:
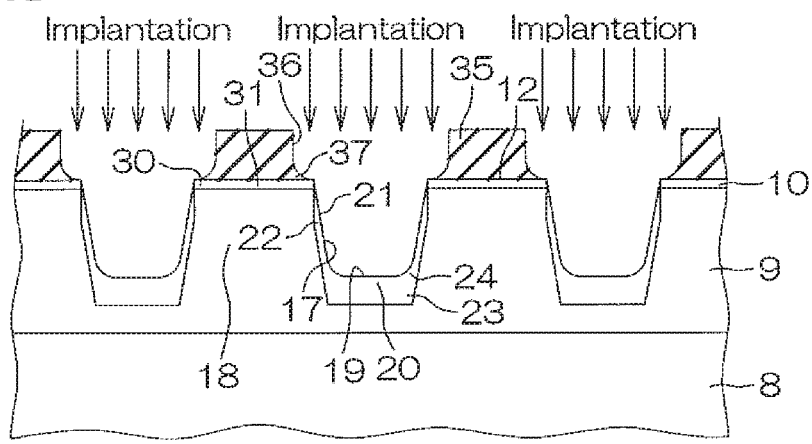
FIG. 20D is a view showing a step following FIG. 20C.

Thereafter, as shown in FIG. 20D, a p type impurity (e.g., aluminum (Al)) is implanted toward the trapezoidal trench 17 through the hard mask 35 while leaving the hard mask 35 used to form the trapezoidal trench 17. The doping of the p type impurity is achieved by an ion implantation method in which, for example, the implanting energy is 380 keV, and the dose amount is $2\times10^{13}$ $cm^{-2}$. After performing the doping of the impurity, the p type layer 23 is formed by performing annealing treatment at, for example, 1775° C.

According to this forming method, ion implantation is performed by use of the hard mask 35 used when the trapezoidal trench 17 is formed, and therefore a step for forming a mask is not required to be added when the p type layer 23 is formed.

Additionally, the trapezoidal trench 17 according to predetermined design can be accurately formed by appropriately adjusting the thickness of the hard mask 35, and impurities can be prevented from being implanted to parts (e.g., top of the unit cell 18) other than the trapezoidal trench 17 during ion implantation. Therefore, an n type region for Schottky junction with the anode electrode 27 can be secured.

Still additionally, in the trapezoidal trench 17, not only the bottom wall 20 but also all of the side wall 22 is allowed to face the open end of the trapezoidal trench 17. Therefore, when a p type impurity is implanted to the SiC epitaxial layer 6 through the trapezoidal trench 17, the impurity that has entered the inside of the trapezoidal trench 17 from the open end of the trapezoidal trench 17 can be allowed to reliably impinge on the side wall 22 of the trapezoidal trench 17. As a result, the p type layer 23 can be formed easily.

<Relationship between Trench and SiC Crystal Structure>

Next, a relationship between a trench and an SiC crystal structure will be described with reference to FIG. 21.

FIG. 21 is a schematic view that represents a unit cell having a 4H—SiC crystal structure.

Various kinds of SiC compounds that differ in crystal structure from each other, such as 3C—SiC, 4H—SiC, and 6H—SiC, can be mentioned as SiC for use in the Schottky barrier diode 1 of the present embodiment.

Among these SiC compounds, the crystal structure of 4H—SiC can be approximated by a hexagonal system, and is formed such that four carbon atoms are combined with one silicon atom. The four carbon atoms are positioned at four vertexes of a regular tetrahedron in which the silicon atom is disposed at the center. In these four carbon atoms, one silicon atom is positioned in the direction of the [0001] axis with respect to the carbon atom, and the other three carbon atoms are positioned on the [000-1] axis side with respect to the silicon atomic-group atom.

The [0001] axis and the [000-1] axis are in the axial direction of a hexagonal column, and a surface (top surface of the hexagonal column) whose normal is the [0001] axis is a (0001) plane (Si plane). On the other hand, a surface (lower surface of the hexagonal column) whose normal is the [000-1] axis is a (000-1) plane (C plane).

Each side surface of the hexagonal column whose normal is the [1-100] axis is a (1-100) plane, and a surface that passes through a pair of ridge lines not adjoining each other and whose normal is the [11-20] axis is a (11-20) plane. These are crystal planes perpendicular to the (0001) plane and perpendicular to the (000-1) plane.

Preferably, in the present embodiment, the SiC substrate 2 whose principal surface is the (0001) plane is used, and the SiC epitaxial layer 6 is grown so that the (0001) plane becomes a principal surface thereon. Additionally, preferably, the trapezoidal trench 17 is formed so that the plane orientation of the side surface 21 becomes a (11-20) plane.

<Modifications of Cross-Sectional Shape of Trench>

Next, modifications of the cross-sectional shape of the trapezoidal trench 17 will be described with reference to FIG. 22A to FIG. 22F.

FIGS. 22A to 22F are views showing modifications of the cross-sectional shape of the trench, and FIG. 22A is a first modification, FIG. 22B is a second modification, FIG. 22C is a third modification, FIG. 22D is a fourth modification, FIG. 22E is a fifth modification, and FIG. 22F is a sixth modification.

In the trapezoidal trench 17, as shown in, for example, FIG. 22A, the contact portion 26 may be formed over the entire inner surface of the trapezoidal trench 17 from the bottom wall 20 to the opening end of the trapezoidal trench 17 through the edge part 24 in the same way as the p type layer 23.

Although only a case in which the cross-sectional shape of the trapezoidal trench 17 is formed such that the side surface 21 of each trapezoidal trench 17 is inclined at angle $\theta_1$ (>90°) with respect to the bottom surface 19 has been mentioned as an example in the description with reference to FIG. 2 and FIG. 3, the cross-sectional shape of the trench is not limited to this.

For example, the trapezoidal trench is not required to incline the whole of the side surface 21, and a part of the side surface 39 (lower part 42 of the side surface 39) may be selectively trapezoidal (tapered), for example, as in a selective trapezoidal trench 41 of FIG. 22B or FIG. 22C, and other parts of the side surface 39 (upper part 43 of the side surface 39) may make an angle of 90° with the bottom surface 19. In this case, the p type layer 23 is formed only at the lower part 42 (trapezoidal part) of the side surface 39 through the edge part 24 from the bottom wall 20 of the selective trapezoidal trench 41. Additionally, the contact portion 26 may be formed only at the bottom wall 20 of the selective trapezoidal trench 41 as shown in FIG. 22B, or may be formed to the upper end of the lower part 42 of the side surface 39 from the bottom wall 20 of the selective trapezoidal trench 41 through the edge part 24 in the same way as the p type layer 23 as shown in FIG. 22C.

Likewise, in the structure of FIG. 22B or FIG. 22C, the lower part 42 of the side surface 39 faces the open end of the selective trapezoidal trench 41, and therefore the p type layer 23 can be formed easily.

The selective trapezoidal trench 41 of FIG. 22B can be formed, for example, through steps shown in FIG. 23A to FIG. 23D.

Figure 23A:
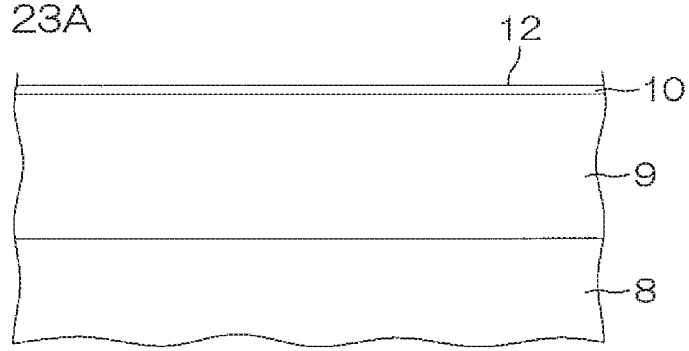
FIG. 23A is a view showing a method for forming the trench and the p type layer shown in FIG. 22B.

More specifically, first, as shown in FIG. 23A, the buffer layer 7, the base drift layer 8, the low-resistance drift layer 9, and the obverse-surface drift layer 10 are subjected to epitaxial growth on the SiC substrate 2 in this order.

Figure 23B:
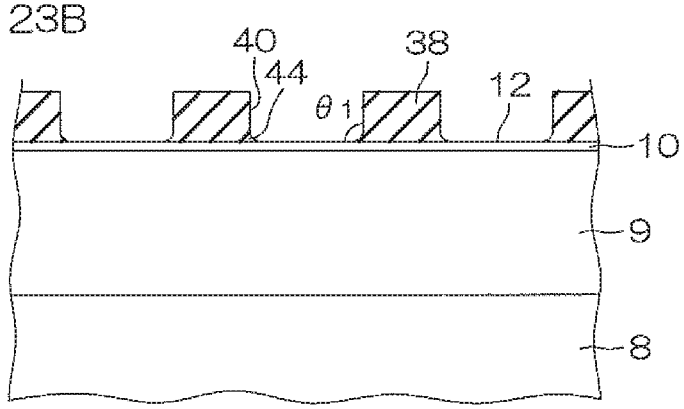
FIG. 23B is a view showing a step following FIG. 23A.

Thereafter, as shown in FIG. 23B, a hard mask 38 made of $SiO_2$ is formed on the surface 12 of the SiC epitaxial layer 6 according to, for example, the CVD method. Preferably, the thickness of the hard mask 38 is 1 μm to 3 μm. Thereafter, the hard mask 38 is subjected to patterning by a well-known photolithography technique and an etching technique. At this time, etching conditions are set so that the amount (thickness) of etching is 1.5 to 2 times as thick as the thickness of the hard mask 38. More specifically, if the thickness of the hard mask 38 is 1 μm to 3 μm, etching conditions (gas kind, etching temperature) are set so that the amount of etching is 1.5 μm to 6 μm. These etching conditions are conditions for setting the amount of over-etching greater than the amount of over-etching set when the hard mask 35 is etched according to the step of FIG. 20B. As a result, an edge part 44 that is inclined at angle $\theta_1$ (91° to 100°>90°) with respect to the surface 12 of the SiC epitaxial layer 6 and that is smaller than the edge part 37 (see FIG. 20B) can be formed at the lower part of the side wall of the opening 40 of the hard mask 38 that has undergone etching.

Figure 23C:
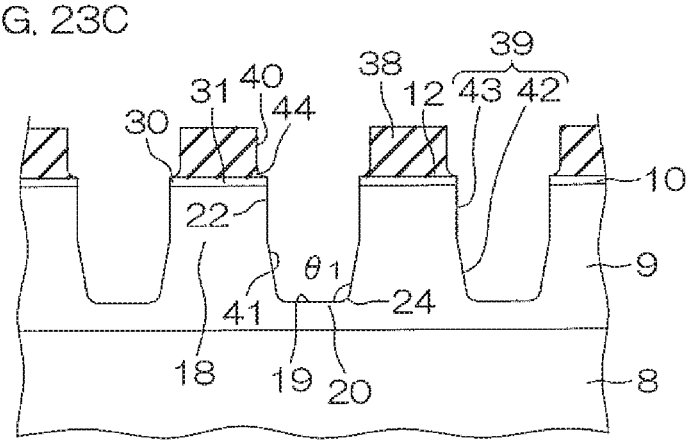
FIG. 23C is a view showing a step following FIG. 23B.

Thereafter, as shown in FIG. 23C, the SiC epitaxial layer 6 is subjected to dry etching from the surface 12 to a depth in which its deepest part reaches a halfway part of the low-resistance drift layer 9 through the hard mask 38, and, as a result, the stripe-like selective trapezoidal trench 41 is formed. The etching conditions at this time are set at gas kind: $O_2+SF_6+HBr$, Bias: 20 W to 100 W, and Internal pressure of the device: 1 Pa to 10 Pa. As a result, the edge part 24 of the bottom wall 20 can be shaped to be curved. Additionally, the edge part 44 smaller than the edge part 37 is formed at the lower part of the side wall of the opening 40 of the hard mask 38, and therefore only the lower part 42 of the side surface 39 of the selective trapezoidal trench 41 can be inclined at angle $\theta_1$ with respect to the bottom surface 19, and the upper part 43 of the side surface 39 can be made at 90° (perpendicular) with respect to the bottom surface 19.

Figure 23D:
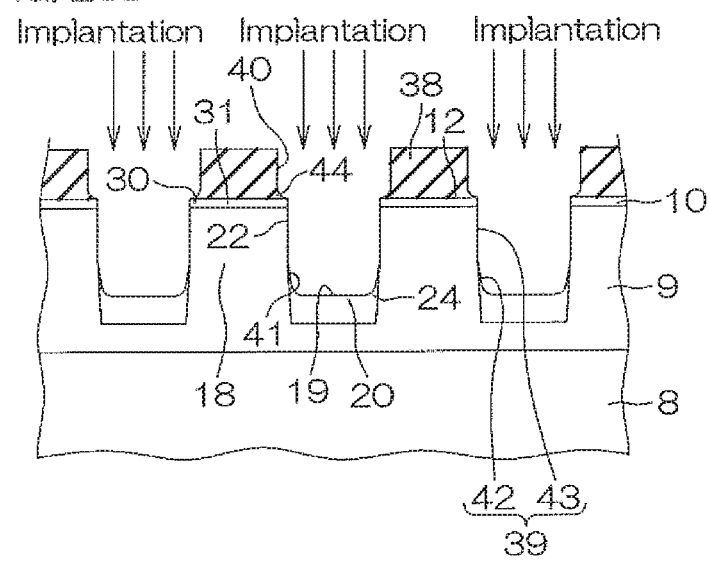
FIG. 23D is a view showing a step following FIG. 23C.

Thereafter, as shown in FIG. 23D, a p type impurity (e.g., aluminum (Al)) is implanted toward the selective trapezoidal trench 41 through the hard mask 38 while leaving the hard mask 38 used to form the selective trapezoidal trench 41. The doping of the p type impurity is achieved by an ion implantation method in which, for example, the implanting energy is 380 keV, and the dose amount is $2\times10^{13}$ $cm^{-2}$.

After performing the doping of the impurity, the p type layer 23 is formed by performing annealing treatment at, for example, 1775° C.

The trench is not required to incline the side surface 22, and, as in a U-shaped trench 45 of FIG. 22D, FIG. 22E, or FIG. 22F, the side surface 21 may make an angle of 90° (perpendicular) with respect to the bottom surface 19. In this case, the p type layer 23 may be formed from the bottom wall 20 of the U-shaped trench 45 to the opening end of the U-shaped trench 45 through the edge part 24 as shown in FIG. 22D and FIG. 22E, or may be formed only at the bottom wall 20 and the edge part 24 of the U-shaped trench 45 as shown in FIG. 22F. Additionally, the contact portion 26 may be formed only at the bottom wall 20 of the U-shaped trench 45 as shown in FIG. 22D and FIG. 22F, or may be formed from the bottom wall 20 of the U-shaped trench 45 to the opening end of the U-shaped trench 45 through the edge part 24 as shown in FIG. 22E in the same way as the p type layer 23.

The U-shaped trench 45 of FIG. 22D can be formed, for example, through steps shown in FIG. 24A to FIG. 24G.

Figure 24A:
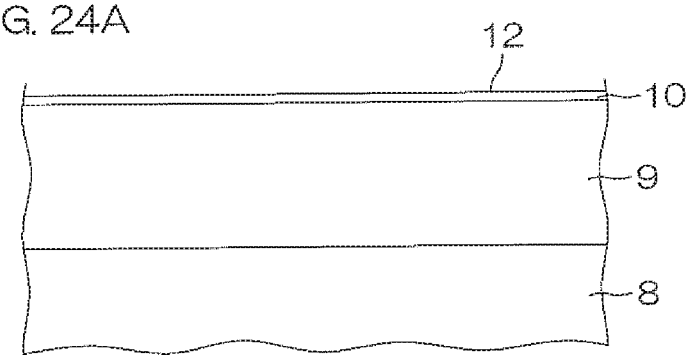
FIG. 24A is a view showing a method for forming the trench and the p type layer shown in FIG. 22D.

First, as shown in FIG. 24A, the buffer layer 7, the base drift layer 8, the low-resistance drift layer 9, and the obverse-surface drift layer 10 are subjected to epitaxial growth on the SiC substrate 2 in this order.

Figure 24B:
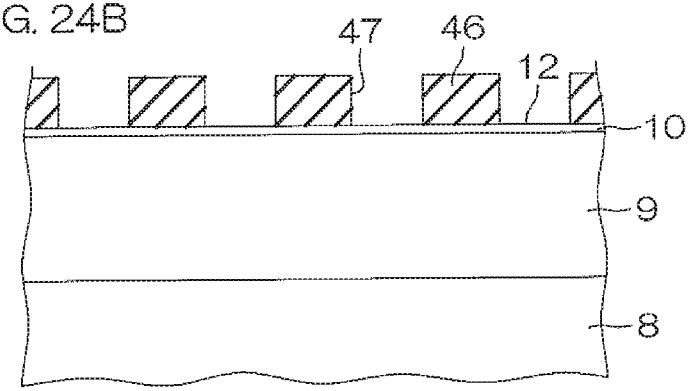
FIG. 24B is a view showing a step following FIG. 24A.

Thereafter, as shown in FIG. 24B, a hard mask 46 made of $SiO_2$ is formed on the surface 12 of the SiC epitaxial layer 6 according to, for example, the CVD (Chemical Vapor Deposition) method. Preferably, the thickness of the hard mask 46 is 1 μm to 3 μm. Thereafter, the hard mask 46 is subjected to patterning by a well-known photolithography technique and an etching technique. At this time, etching conditions are set so that the amount (thickness) of etching is 2 to 3 times as thick as the thickness of the hard mask 46. More specifically, if the thickness of the hard mask 46 is 1 μm to 3 μm, etching conditions (gas kind, etching temperature) are set so that the amount of etching is 2 μm to 6 μm. These etching conditions are conditions for setting the amount of over-etching greater than the amount of over-etching set when the hard mask 38 is etched according to the step of FIG. 23B. As a result, the lower part of the side wall of the opening 47 of the hard mask 46 that has undergone etching can be formed at an angle of 90° (perpendicular) with respect to the surface 12 of the SiC epitaxial layer 6.

Figure 24C:
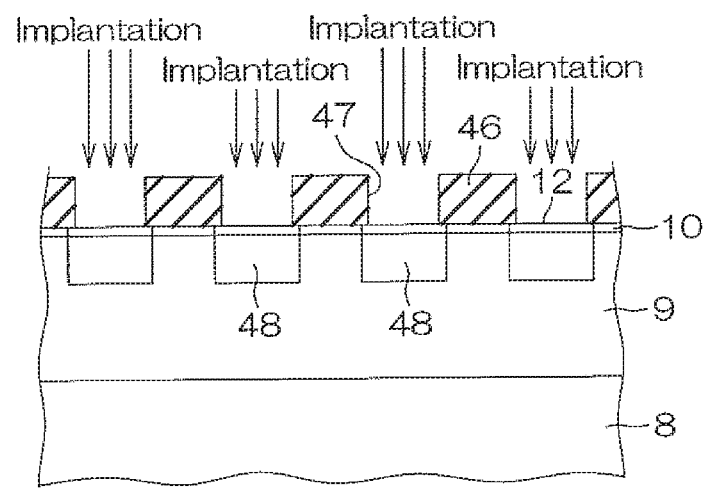
FIG. 24C is a view showing a step following FIG. 24B.

Thereafter, as shown in FIG. 24C, a p type impurity (e.g., aluminum (Al)) is implanted toward the surface of the SiC epitaxial layer 6 through the hard mask 46 that has undergone patterning. The doping of the p type impurity is achieved by an ion implantation method in which, for example, the implanting energy is 380 keV, and the dose amount is $2\times10^{13}$ $cm^{-2}$. After performing the doping of the impurity, the p type layer 48 is formed by performing annealing treatment at, for example, 1775° C.

Figure 24D:
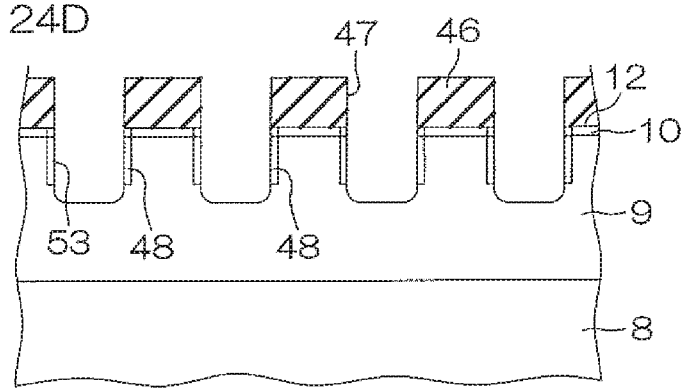
FIG. 24D is a view showing a step following FIG. 24C.

Thereafter, as shown in FIG. 24D, the SiC epitaxial layer 6 is subjected to dry etching from the surface 12 to a depth penetrating the bottom part of the p type layer 48 through the hard mask 46 while leaving the hard mask 46 used to form the p type layer 48, and, as a result, a stripe-like intermediate trench 53 is formed. As a result, the remainder (lateral part) of the p type layer 48 remains at the side wall of the intermediate trench 53.

Figure 24E:
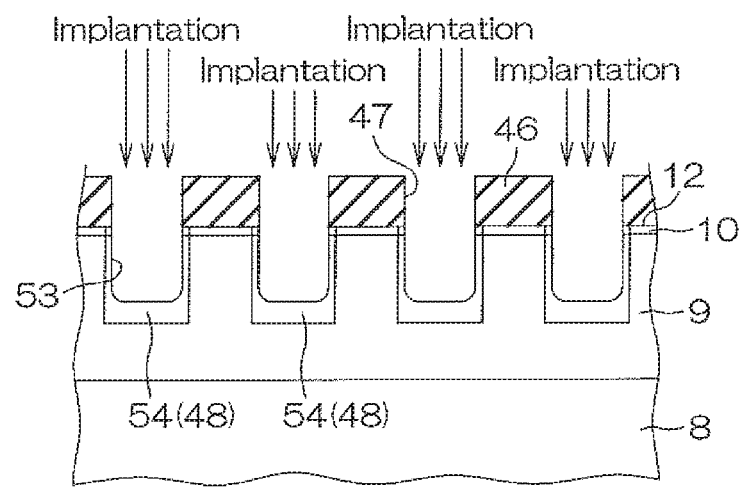
FIG. 24E is a view showing a step following FIG. 24D.

Thereafter, as shown in FIG. 24E, a p type impurity (e.g., aluminum (Al)) is implanted toward the intermediate trench 53 through the hard mask 46 while leaving the hard mask 46 used to form the intermediate trench 53. The doping of the p type impurity is achieved by an ion implantation method in which, for example, the implanting energy is 380 keV, and the dose amount is $2\times10^{13}$ cm$^{-2}$. After performing the doping of the impurity, annealing treatment is performed at, for example, 1775° C., and, as a result, the implanted impurity mixes with the impurity of the p type layer 48, and a p type layer 54 is formed.

Figure 24F:
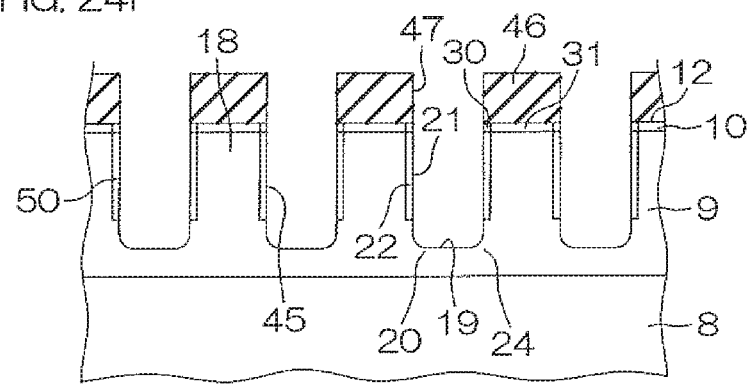
FIG. 24F is a view showing a step following FIG. 24E.

Thereafter, as shown in FIG. 24F, the SiC epitaxial layer 6 is subjected to dry etching from the surface 12 to a depth penetrating the bottom part of the p type layer 54 through the hard mask 46 while leaving the hard mask 46 used to form the p type layer 54, and, as a result, the stripe-like U-shaped trench 45 is formed. As a result, the remainder (lateral part) of the p type layer 54 remains at the side wall 22 of the U-shaped trench 45.

Figure 24G:
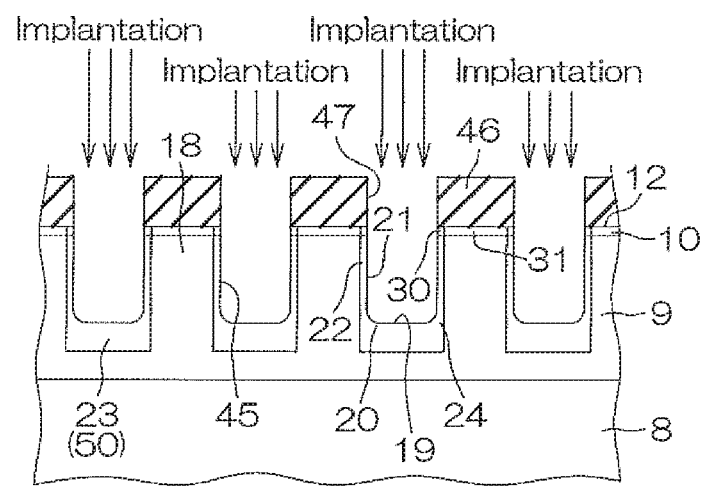
FIG. 24G is a view showing a step following FIG. 24F.

Thereafter, as shown in FIG. 24G, a p type impurity (e.g., aluminum (Al)) is implanted toward the U-shaped trench 45 through the hard mask 46 while leaving the hard mask 46 used to form the U-shaped trench 45. The doping of the p type impurity is achieved by an ion implantation method in which, for example, the implanting energy is 380 keV, and the dose amount is $2\times10^{13}$ cm$^{-2}$. After performing the doping of the impurity, annealing treatment is performed at, for example, 1775° C., and, as a result, the implanted impurity mixes with the impurity of the p type layer 54, and the p type layer 23 is formed.

As described above, even if the side surface 21 of the U-shaped trench 45 is perpendicular to the bottom surface 19, the p type layer 23 can be reliably formed at the side wall 22 of the U-shaped trench 45 by repeatedly performing a step of forming the p type layers 48 and 54 each of which has a predetermined depth from the surface 12 by performing ion implantation toward the surface 12 of the SiC epitaxial layer 6 and a step of forming the trenches 53 and 45 penetrating the bottom parts of the p type layers 48 and 54 and of leaving the lateral parts of the p type layers 48 and 54 at the side walls of the trenches 53 and 45. The repetition of the ion implantation and the trench formation is not limited to two times, and may be three, four, or more times.

Additionally, ion implantation is performed while continuously using the hard mask 46 that has been used when the p type layers 48, 54 and the trenches 53, 45 are formed, and therefore there is no need to add a step of forming a mask when the p type layer 23 is formed.

Although the embodiment of the present invention has been described as above, the present invention can be embodied in other modes.

For example, although a variation of a Schottky barrier diode in which a trench is formed in the SiC epitaxial layer 6 has been shown as one example of the present invention in the aforementioned embodiment, the present invention is not limited to this variation in which a trench is formed, and no specific limitations are imposed on the shape of a semiconductor device if it is a semiconductor device whose threshold voltage $V_{th}$ is 0.3 V to 0.7 V and whose leakage current $J_r$ in the rated voltage $V_R$ is $1\times10^{-9}$ A/cm$^2$ to $1\times10^{-4}$ A/cm$^2$. For example, it may be the aforementioned JBS structure, the aforementioned planar structure, and the aforementioned pseudo-JBS structure.

Additionally, an arrangement may be employed in which the conductivity type of each semiconductor part of the Schottky barrier diode 1 is inverted. For example, in the Schottky barrier diode 1, the part of a p type may be an n type, and the part of an n type may be a p type.

Additionally, the epitaxial layer is not limited to an epitaxial layer made of SiC, and it may be a wide bandgap semiconductor other than SiC, such as a semiconductor having an insulation breakdown electric field greater than 2 MV/cm, and, more specifically, it may be GaN (whose insulation breakdown electric field is about 3 MV/cm and whose bandgap width is about 3.42 eV), or may be diamond (whose insulation breakdown electric field is about 8 MV/cm and whose bandgap width is about 5.47 eV).

Additionally, the planar shape of the trench is not required to be like stripes, and it may be, for example, a lattice trench 55 shown in FIG. 25. In this case, a unit cell 56 is formed in a rectangular parallelepiped shape at each window part of the lattice trench 55. Additionally, preferably, the lattice trench 55 is formed so that the plane orientation of a side surface becomes a (11-20) plane and a (1-100) plane.

Additionally, an insulating film may be formed on a part of or all of the inner surface (bottom surface and side surface) of a trench. For example, in FIG. 26 to FIG. 30, each of the insulating films 57 to 61 is formed on a part of or all of the side surface 21 and the bottom surface 19 of the trapezoidal trench 17.

Figure 26:
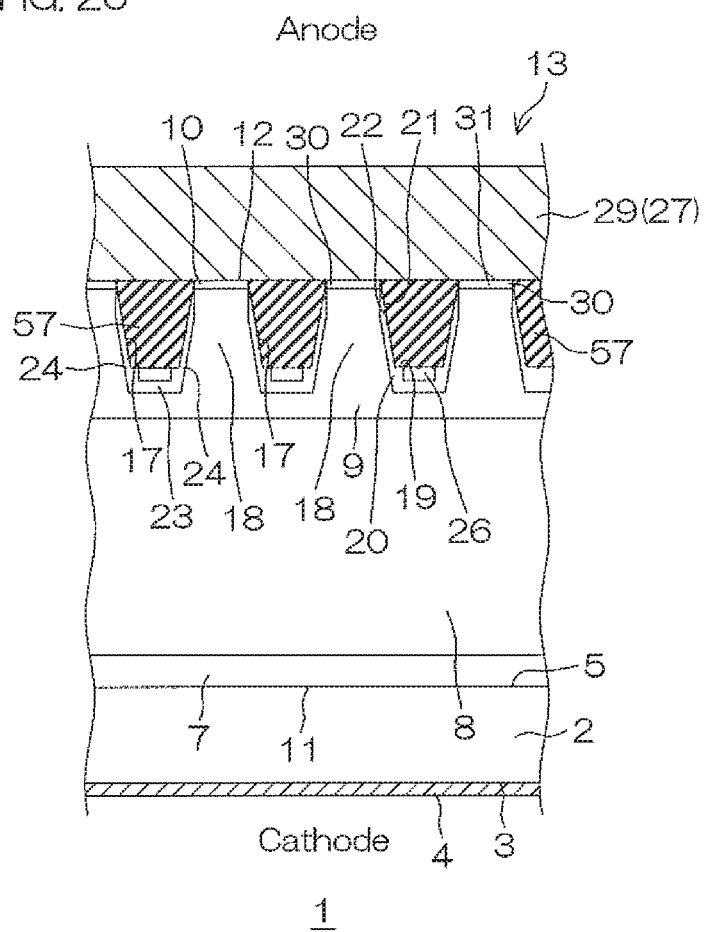
FIG. 26 is a view showing an example (first mode) in which an insulating film is formed on a surface of a trench.

More specifically, the insulating film 57 of FIG. 26 is embedded from the bottom surface 19 of the trapezoidal trench 17 to the opening end of the trapezoidal trench 17 so that its upper surface becomes flush with the surface 12 of the SiC epitaxial layer 6, and is contiguous to the entire surface of both of the bottom surface 19 and the side surface 21.

Figure 27:
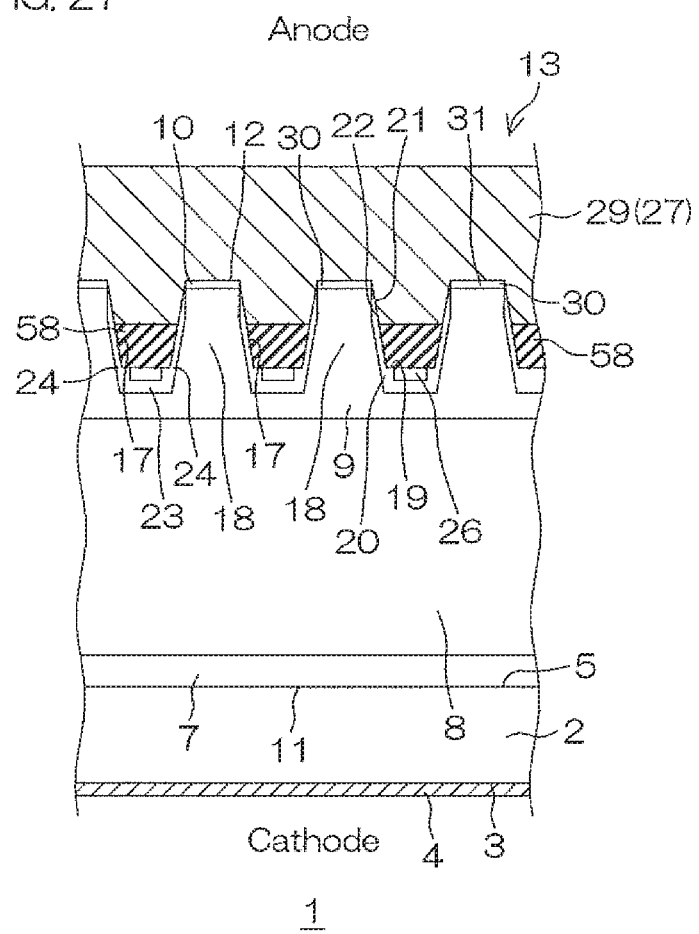
FIG. 27 is a view showing an example (second mode) in which an insulating film is formed on a surface of a trench.

The insulating film 58 of FIG. 27 is embedded from the bottom surface 19 of the trapezoidal trench 17 to an intermediate part in the depth direction of the trapezoidal trench 17, and is contiguous to the entire surface of the bottom surface 19 and to a part of the side surface 21.

Figure 28:
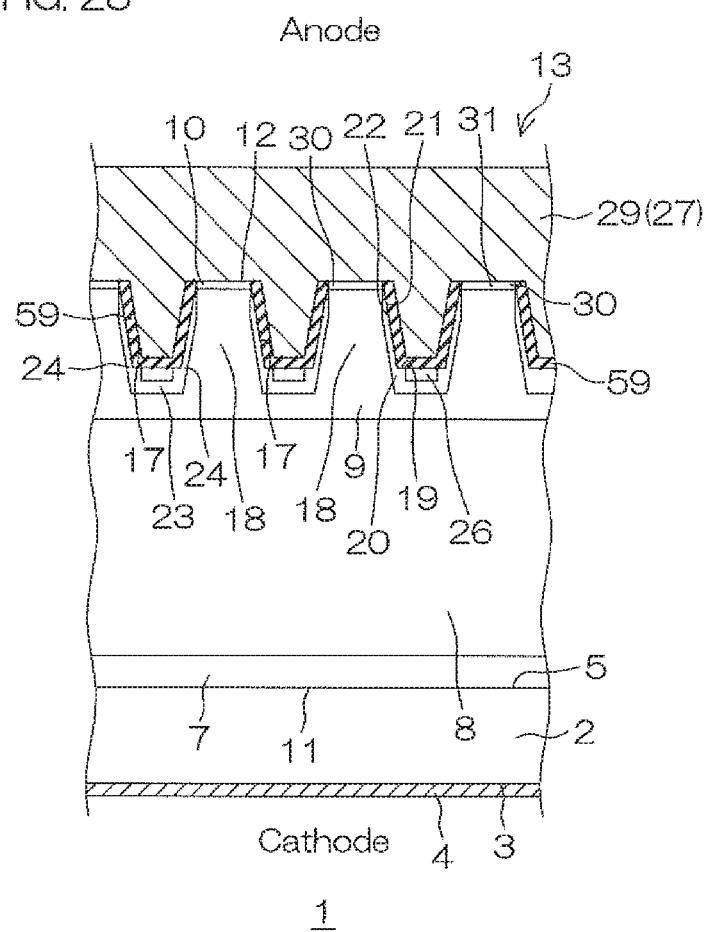
FIG. 28 is a view showing an example (third mode) in which an insulating film is formed on a surface of a trench.

The insulating film 59 of FIG. 28 is formed into a thin film reaching the opening end of the trapezoidal trench 17 through the edge part 24 from the bottom wall 20 so as to leave a space in the trapezoidal trench 17. As a result, it is contiguous to the entire surface of both of the bottom surface 19 and the side surface 21 of the trapezoidal trench 17.

Figure 29:
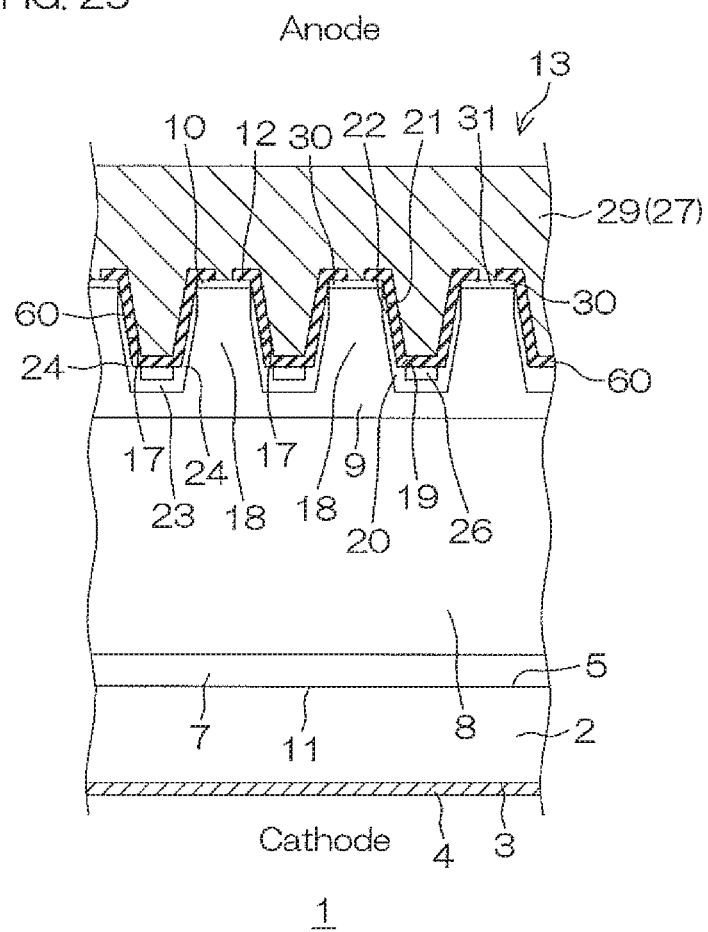
FIG. 29 is a view showing an example (fourth mode) in which an insulating film is formed on a surface of a trench.

The insulating film 60 of FIG. 29 is formed into a thin film with which the peripheral edge 30 of the opening end of the trapezoidal trench 17 is covered from the surface side (12) through the edge part 24 from the bottom wall 20 so as to leave a space in the trapezoidal trench 17. As a result, it is contiguous to the entire surface of both of the bottom surface 19 and the side surface 21 of the trapezoidal trench 17.

Figure 30:
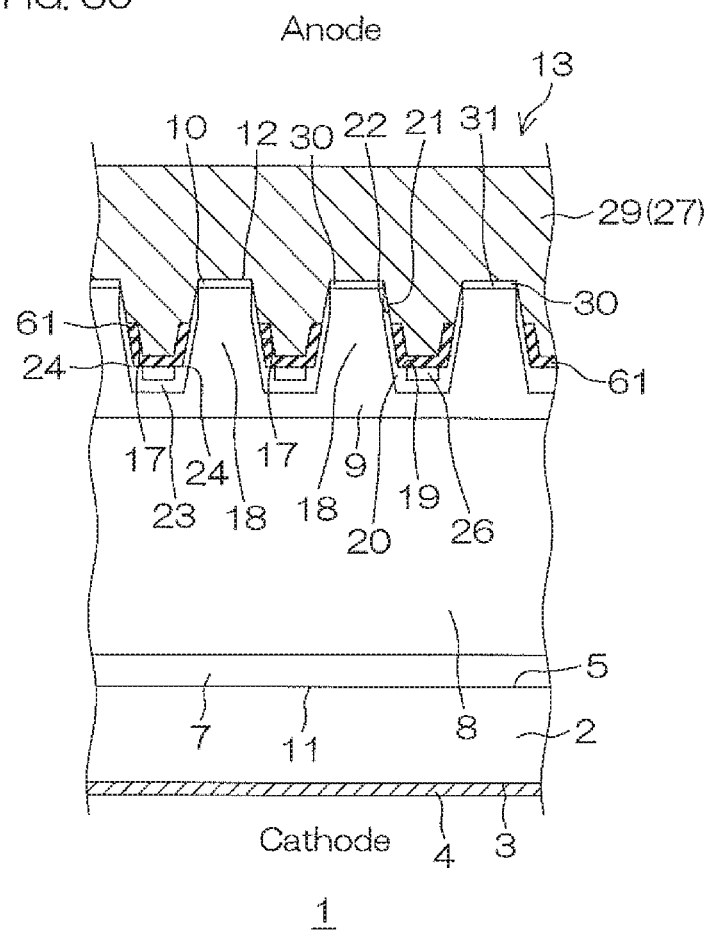
FIG. 30 is a view showing an example (fifth mode) in which an insulating film is formed on a surface of a trench.

The insulating film 61 of FIG. 30 is formed into a thin film reaching an intermediate part in the depth direction of the trapezoidal trench 17 in the side surface 21 through the edge part 24 from the bottom wall 20 so as to leave a space in the trapezoidal trench 17. As a result, it is contiguous to the entire surface of the bottom surface 19 of the trapezoidal trench 17 and to a part of the side surface 21.

The capacity can be reduced by forming each of the insulating films 57 to 61 at a part of or all of the side surface 21 and the bottom surface 19 of the trapezoidal trench 17 in this way, and therefore the switching speed can be increased.

Figure 31:
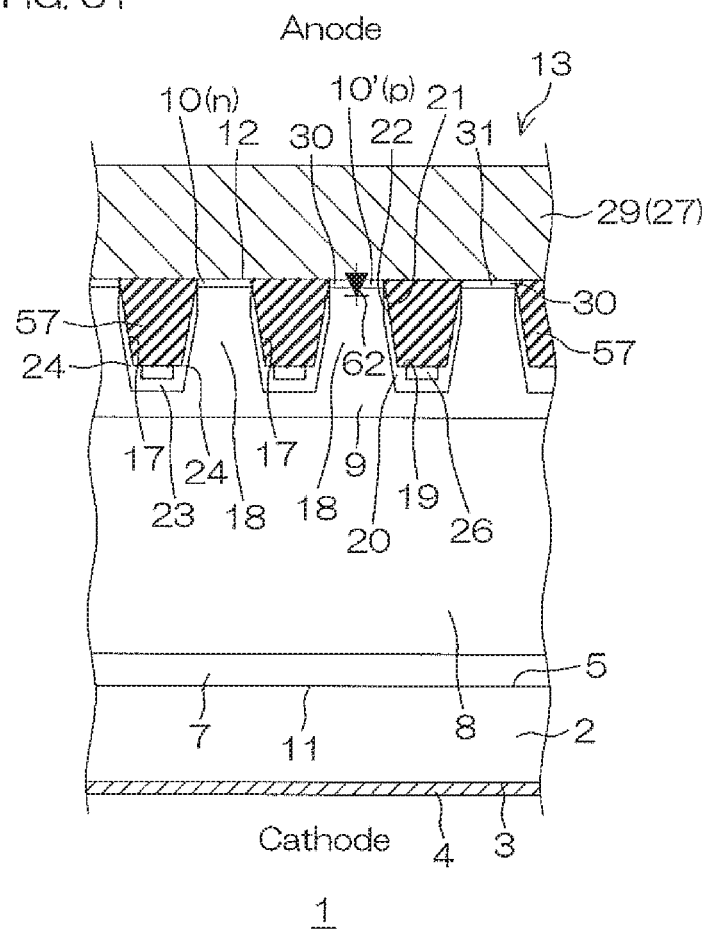
FIG. 31 is a view showing an example (sixth mode) in which an insulating film is formed on a surface of a trench.
Figure 32:
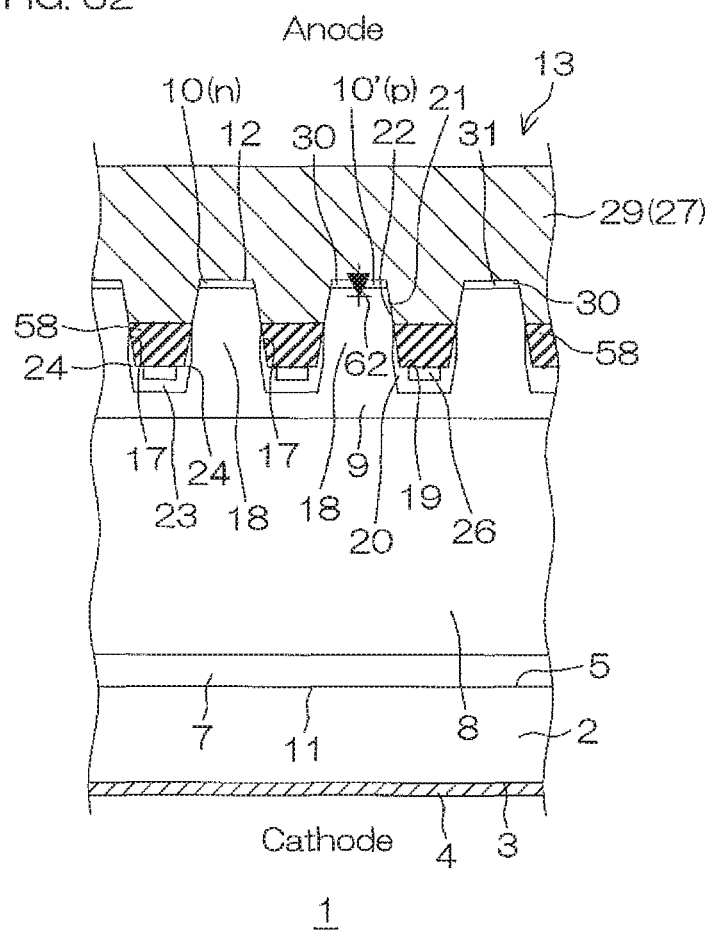
FIG. 32 is a view showing an example (seventh mode) in which an insulating film is formed on a surface of a trench.

Additionally, in the example of FIG. 31, a part of the n type obverse-surface drift layer 10 is replaced with a p type surface layer 10' that has been made into a p type one, and the anode electrode 27 is brought into contact with this p type surface layer 10', and, as a result, it is possible to provide a pn diode 62 composed of the p type surface layer 10' and the n type SiC epitaxial layer 6 (low-resistance drift layer 9). Therefore, it is possible to obtain the same effect as in the pn diode 25 of FIG. 16. Additionally, in the example of FIG. 32, the p type layer 23 is formed only to the intermediate part in the depth direction of the trapezoidal trench 17, and the p type layer 23 is covered and hidden with the insulating film 58. In this case, in the same way as in FIG. 31, a pn diode 62 can be provided by replacing a part of the n type obverse-surface drift layer 10 with a p type surface layer 10' that has been made into a p type one and by bringing the anode electrode 27 into contact with this p type surface layer 10'.

Additionally, a Schottky junction (heterojunction) can be made with the SiC epitaxial layer 6 by use of, for example, molybdenum (Mo) or titanium (Ti) as an anode electrode besides, for example, aluminum and polysilicon mentioned above.

Additionally, for example, Al (aluminum) can be used as a p type impurity to form the p type layer 23.

Additionally, the p type layer 23 is not necessarily required to be formed.

The semiconductor device (semiconductor power device) of the present invention can be built in a power module for use in, for example, an inverter circuit that forms a driving circuit to drive an electric motor used as a power source for electric vehicles (including hybrid automobiles), trains, industrial robots, etc. Additionally, it can be built in a power module for use in an inverter circuit that converts power generated by a solar battery, a wind generator, or other power generators (particularly, a private electric generator) so as to match the electric power of a commercial power source.

The embodiments of the present invention are merely specific examples used to clarify the technical contents of the present invention, and the present invention should not be understood as being limited to these examples, and the scope of the present invention is to be determined solely by the appended claims.

Additionally, the components shown in each embodiment of the present invention can be combined together within the scope of the present invention.

The present application corresponds to Japanese Patent Application No. 2011-165660 filed in the Japan Patent Office on Jul. 28, 2011, and the entire disclosure of the application is incorporated herein by reference.

REFERENCE SIGNS LIST

1 Schottky barrier diode
2 SiC substrate
6 SiC epitaxial layer
7 Buffer layer
8 Base drift layer
9 Low-resistance drift layer
10 Obverse-surface drift layer
11 Reverse surface (of SiC epitaxial layer)
12 Surface (of SiC epitaxial layer)
17 Trapezoidal trench
18 Unit cell
19 Bottom surface (of trench)
20 Bottom wall (of trench)
21 Side surface (of trench)
22 Side wall (of trench)
23 P type layer
24 Edge part
25 Pn diode
26 Contact portion
27 Anode electrode
28 First electrode
29 Second electrode
30 Peripheral edge (of unit cell)
31 Central part (of unit cell)
41 Selective trapezoidal trench
42 Lower part of side surface (of selective trapezoidal trench)
43 Upper part of side surface (of selective trapezoidal trench)
45 U-shaped trench
55 Lattice trench
56 Unit cell

The invention claimed is:

1. A semiconductor device, comprising:
a first conductivity type semiconductor layer made of SiC;
a Schottky electrode formed to come into contact with at least a portion of a surface of the first conductivity type semiconductor layer;
a field region surrounding the Schottky electrode;
an annular trench formed on the field region and surrounding the Schottky electrode; and
a second conductivity type layer formed under a portion of the Schottky electrode outside at least the portion of the surface of the semiconductor layer, wherein
a plurality of the annular trenches are arranged at intervals, and
a width of a part sandwiched between the annular trenches adjoining each other becomes greater in proportion to an approach to a far side from a near side with respect to the Schottky electrode.

2. The semiconductor device according to claim 1, wherein
a breakdown voltage VB of the semiconductor device is 700 V or more, and
a rated voltage VR of the semiconductor device is 50 to 90% of the breakdown voltage VB that is 700 V or more.

3. The semiconductor device according to claim 1, wherein on-resistance Ron·A of the semiconductor device is 0.3 mΩ·cm$^2$ to 3 mΩ·cm$^2$.

4. The semiconductor device according to claim 1, wherein
a trench having a side wall and a bottom wall is formed on a side of the surface of the first conductivity type semiconductor layer, and
an edge part of the bottom wall of the trench has a curvature radius R that satisfies the following formula (1):

$$0.01L < R < 10L \qquad (1)$$

wherein, L designates a linear distance between edge parts facing each other along a width direction of the trench.

5. The semiconductor device according to claim 4, wherein the first conductivity type semiconductor layer includes a second conductivity type electric-field-moderating portion that is selectively formed at the bottom wall of the trench and at the edge part of the bottom wall.

6. The semiconductor device according to claim 5, wherein the electric-field-moderating portion is formed to straddle between the edge part of the bottom wall of the trench and the side wall of the trench.

7. The semiconductor device according to claim 6, wherein the electric-field-moderating portion is formed to lead to an opening end of the trench along the side wall of the trench.

8. The semiconductor device according to claim 5, wherein
the Schottky electrode is formed so as to be embedded in the trench, and
the electric-field-moderating portion has a contact portion at the bottom wall of the trench and the contact portion makes an ohmic contact with the Schottky electrode embedded in the trench.

9. The semiconductor device according to claim 4, wherein the trench includes a taper trench that has the bottom wall having a planar shape and the side wall inclined at an angle exceeding 90° with respect to the bottom wall having a planar shape.

10. The semiconductor device according to claim 1, wherein a threshold voltage Vth of the semiconductor device is 0.3 V to 0.7 V, and a leakage current Jr in a rated voltage VR of the semiconductor device is $1 \times 10^{-9}$ A/cm$^2$ to $1 \times 10^{-4}$ A/cm$^2$.

11. The semiconductor device according to claim 1, wherein the trench includes a stripe trench formed in a stripe manner.

12. The semiconductor device according to claim 1, wherein the trench includes a lattice trench formed in a grid-like manner.

13. The semiconductor device according to claim 1, wherein the second conductivity type layer is formed at a bottom wall and a side wall of the annular trench.

14. The semiconductor device according to claim 1, wherein the second conductivity layer extends under the field region.

15. A semiconductor device, comprising:
a first conductivity type semiconductor layer made of a wide bandgap semiconductor;
a Schottky electrode formed to come into contact with at least a portion of a surface of the first conductivity type semiconductor layer;
a field region surrounding the Schottky electrode;
an annular trench formed on the field region and surrounding the Schottky electrode; and
a second conductivity type layer formed under a portion of the Schottky electrode outside at least the portion of the surface of the semiconductor layer, wherein
the first conductivity type semiconductor layer has a first part of a first conductivity type to which a first electric field is applied when a reverse voltage is applied and a second part of the first conductivity type to which a second electric field relatively higher than the first electric field is applied,
the Schottky electrode includes a first electrode that forms a first Schottky barrier with the first part and a second electrode that forms a second Schottky barrier with the second part, the second Schottky barrier being relatively higher than the first Schottky barrier,
a plurality of the annular trenches are arranged at intervals, and
a width of a part sandwiched between the annular trenches adjoining each other becomes greater in proportion to an approach to a far side from a near side with respect to the Schottky electrode.

16. The semiconductor device according to claim 15, wherein the first part of the first conductivity type semiconductor layer is formed at a peripheral edge of an opening end of a trench having a side wall and a bottom wall formed on a side of the surface of the first conductivity type semiconductor layer, whereas the second part of the first conductivity type semiconductor layer is formed at a part adjoining the peripheral edge in the surface portion of the first conductivity type semiconductor layer.

17. The semiconductor device according to claim 15, wherein
the first conductivity type semiconductor layer includes a base drift layer that has a first impurity concentration and a low-resistance drift layer that is formed on the base drift layer and that has a second impurity concentration relatively higher than the first impurity concentration, and
a trench is formed on a side of the surface of the first conductivity type semiconductor layer so that a deepest part thereof reaches the low-resistance drift layer, and
a part of the first conductivity type semiconductor layer is partitioned as a unit cell.

18. The semiconductor device according to claim 17, wherein the first impurity concentration of the base drift layer becomes lower in proportion to an approach to the surface from a reverse surface of the first conductivity type semiconductor layer.

19. The semiconductor device according to claim 17, wherein the second impurity concentration of the low-resistance drift layer is constant in proportion to an approach to the surface from a reverse surface of the first conductivity type semiconductor layer.

20. The semiconductor device according to claim 17, wherein the second impurity concentration of the low-resistance drift layer becomes lower in proportion to an approach to the surface from a reverse surface of the first conductivity type semiconductor layer.

21. The semiconductor device according to claim 17, wherein the first conductivity type semiconductor layer further includes an obverse-surface drift layer that is formed on the low-resistance drift layer and that has a third impurity concentration relatively lower than the second impurity concentration.

22. The semiconductor device according to claim 17, wherein the first conductivity type semiconductor layer further includes a substrate and a buffer layer that is formed on the substrate and that has a fourth impurity concentration relatively higher than the first impurity concentration.

23. The semiconductor device according to claim 15, wherein an insulation breakdown electric field of the wide bandgap semiconductor is greater than 1 MV/cm.

24. The semiconductor device according to claim 15, wherein the wide bandgap semiconductor is made of SiC, or GaN, or diamond.

25. The semiconductor device according to claim 15, wherein
a threshold voltage Vth of the semiconductor device is 0.3 V to 0.7 V, and a leakage current Jr in a rated voltage VR of the semiconductor device is $1 \times 10^{-9}$ A/cm$^2$ to $1 \times 10^{-4}$ A/cm$^2$,
a breakdown voltage VB of the semiconductor device is 700 V or more, and
on-resistance Ron·A of the semiconductor device is 0.3 mΩ·cm$^2$ to 3 mΩ·cm$^2$.

26. A semiconductor device, comprising:
a first conductivity type semiconductor layer made of SiC;
a Schottky electrode formed to come into contact with at least a portion of a surface of the semiconductor layer;
the at least a portion of the surface of the semiconductor layer formed in an active region defined by a field region surrounding the Schottky electrode;
an annular trench formed on the field region and surrounding the Schottky electrode; and
a second conductivity type layer formed under a portion of the Schottky electrode outside the at least a portion of the surface of the semiconductor layer proximate the edge of the active region, wherein
a plurality of the annular trenches are arranged at intervals, and a width of a part sandwiched between the annular trenches adjoining each other becomes greater in proportion to an approach to a far side from a near side with respect to the Schottky electrode.

27. The semiconductor device according to claim 26, wherein the second conductivity layer extends under the field region.

* * * * *